United States Patent [19]

Abe

[11] Patent Number: 5,581,577
[45] Date of Patent: Dec. 3, 1996

[54] DEVICE FOR AND METHOD OF COUNTING BIT ERRORS AND DEVICE FOR AND METHOD OF IDENTIFYING SIGNALS

[75] Inventor: Masami Abe, Tokyo, Japan

[73] Assignee: Oki Electric Industry Co., Ltd., Tokyo, Japan

[21] Appl. No.: 196,258

[22] PCT Filed: Jun. 21, 1993

[86] PCT No.: PCT/JP93/00831

§ 371 Date: Feb. 16, 1994

§ 102(e) Date: Feb. 16, 1994

[87] PCT Pub. No.: WO94/00915

PCT Pub. Date: Jan. 6, 1994

[30] Foreign Application Priority Data

Jun. 22, 1992 [JP] Japan .................. 4-163066

[51] Int. Cl.$^6$ .......................... H04B 3/46; H04B 17/00
[52] U.S. Cl. .................. 375/225; 375/262; 375/341; 371/5.1; 371/43
[58] Field of Search .......................... 375/262, 225, 375/265, 341; 371/1, 5.1, 43

[56] References Cited

U.S. PATENT DOCUMENTS

| | | | |
|---|---|---|---|
| 4,710,746 | 12/1987 | Shimoda et al. | 371/43 |
| 5,325,374 | 6/1994 | Hoshi et al. | 371/43 |

FOREIGN PATENT DOCUMENTS

| | | |
|---|---|---|
| 49-100903 | 9/1974 | Japan . |
| 52-103902 | 8/1977 | Japan . |
| 59-19455 | 1/1984 | Japan . |
| 62-78921 | 4/1987 | Japan . |
| 63-26035 | 2/1988 | Japan . |
| 1-235073 | 9/1989 | Japan . |
| 3-198545 | 8/1991 | Japan . |

OTHER PUBLICATIONS

Qualcomm Incorporated, Technical Data Sheet, "Qo256 K=7 Multi–Code Rate Viterbi Decoder", 1990–6, pp. 3–13.

*Primary Examiner*—Stephen Chin
*Assistant Examiner*—Don Vo
*Attorney, Agent, or Firm*—Spencer & Frank

[57] ABSTRACT

A bit error counter for a digital communication system has transmitter and receiver. The transmitter includes circuitry for convolution encoding of an input original signal and outputting a transmission signal. The receiver includes error correcting/decoding circuitry for inputting a reception signal corresponding to the transmission signal and outputting a decoded signal, and when an overflow occurs, for outputting an overflow signal. State monitoring circuitry is provided for receiving the overflow signal and issuing a switching instruction signal to a switch only when the overflow signal is received. The switch also receives the decoded signal and outputs at least one of a bit error rate or a number of errors when the switching instruction signal is received. The switch outputs the decoded signal when the switching instruction signal is not received. Re-encoding circuitry receives the decoded signal from the switch and outputs a re-encoded signal by subjecting the decoded signal to the same encoding as that of the reception signal. A comparator receives the re-encoded signal and a delayed reception signal, and outputs the bit error rate and the number of errors.

66 Claims, 24 Drawing Sheets

FUNCTIONAL BLOCK DIAGRAM ILLUSTRATING
FIRST EMBODIMENT OF BIT ERROR COUNTER DEVICE

FUNCTIONAL BLOCK DIAGRAM ILLUSTRATING
FIRST EMBODIMENT OF BIT ERROR COUNTER DEVICE

FLOWCHART ILLUSTRATING OPERATION OF ERROR CORRECTING/ENCODING PART

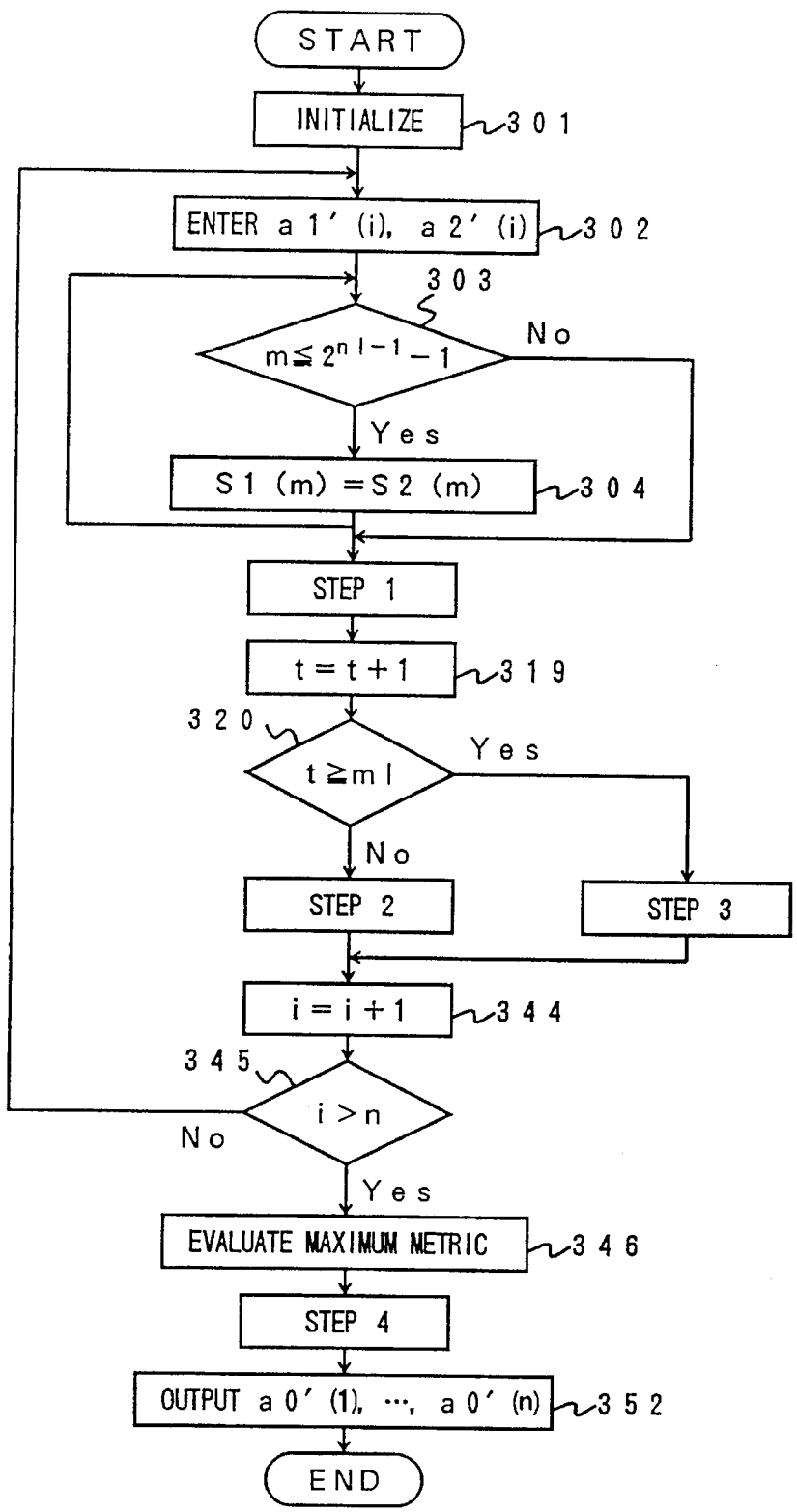
FLOWCHART ILLUSTRATING OPERATION OF ERROR CORRECTING/DECODING PART
F I G. 3 a

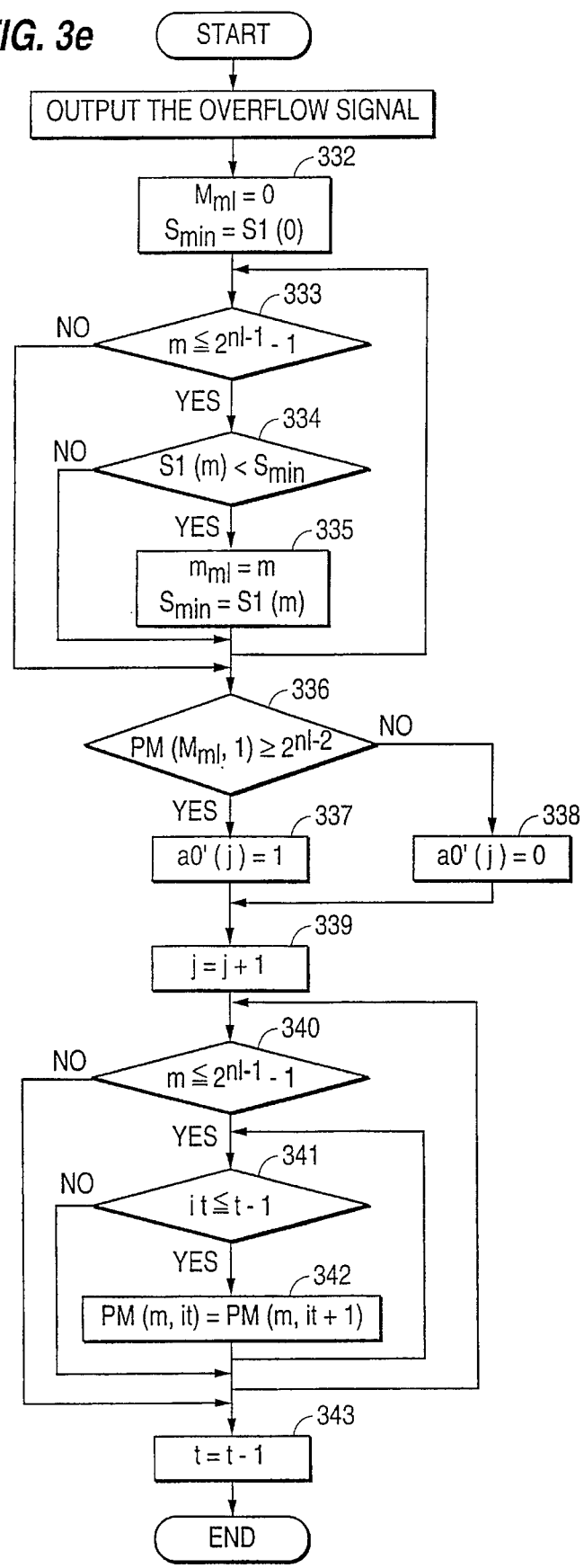

DETAILED FUNCTIONAL BLOCK DIAGRAM ILLUSTRATING
OPERATION OF THE DELAY PART

FLOWCHART ILLUSTRATING OPERATION OF THE DELAY PART

FLOWCHART ILLUSTRATING OPERATION
OF THE COMPARATOR PART

FLOWCHART ILLUSTRATING OPERATION OF THE COMPARATOR PART

FUNCTIONAL BLOCK DIAGRAM ILLUSTRATING
SECOND EMBODIMENT OF THE BIT ERROR COUNTER DEVICE

FLOWCHART ILLUSTRATING OPERATION OF THE ERROR DETECTION CODE EVALUATING PART

FLOWCHART ILLUSTRATING OPERATION OF THE ERROR DETECTING PART

FLOWCHART ILLUSTRATING OPERATION
OF THE ERROR DETECTING PART

FLOWCHART ILLUSTRATING OPERATION OF THE RE-ENCODER
PART FOR CONTROL SIGNALS

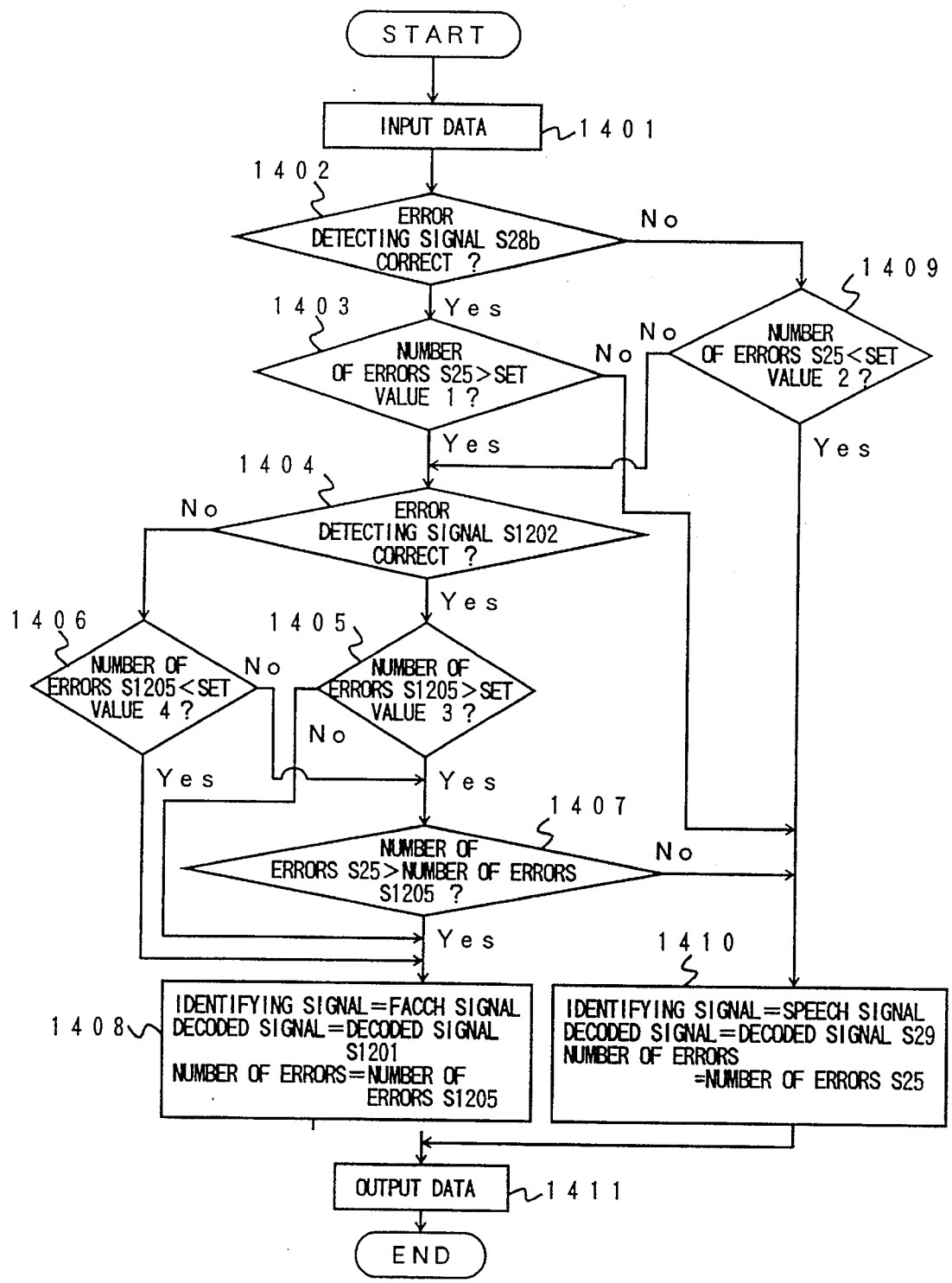
FLOWCHART ILLUSTRATING OPERATION OF SIGNAL IDENTIFICATION PROCEESSOR PART
F I G. 1 4

FLOWCHART ILLUSTRATING OPERATION OF THE ERROR DETECTING PART FOR CONTROL SIGNALS

FLOWCHART ILLUSTRATING OPERATION OF SWITCHING PART OF THE SIGNAL IDENTIFIER DEVICE

DEVICE FOR AND METHOD OF COUNTING BIT ERRORS AND DEVICE FOR AND METHOD OF IDENTIFYING SIGNALS

TECHNICAL FIELD

The present invention relates to a device for and a method of counting the number of bit errors in a reception signal in digital communication, and, more particularly, relates to a device for and a method of identifying whether a reception signal is a speech signal or a control signal and outputting an identification signal, a decoded signal, and the number of bit errors counted.

BACKGROUND ART

For TDMA digital mobile communication, a transmission system is used which transmits different signals such as a speech signal and a FACCH (Fast Associated Control Channel) signal, which is a kind of a control signal with use of the same data region of a channel. These two kinds of the signals are same in the numbers of total bits, but different from one another in the method of error correction or error detection. The speech signal or the FACCH signal is transmitted from a transmission side in accordance with the conditions of the use thereof. However, a flag is not transmitted to identify whether a transmission signal is the speech signal or the FACCH signal. A reception side must accordingly judge whether a transmitted signal is a speech signal or a FACCH signal.

The following describes the configuration of a prior art signal identifier device.

The prior art signal identifier device comprises an error correcting/decoding part for processing speech signals, an error detecting/decoding part for processing speech signals, an error correcting/decoding part for control signals, and an error detecting/decoding part for control signals. The error correcting/decoding part for speech signals employs a decoding method for error correction codes used in encoding part or all of the speech signals at the transmission side. The error correcting/decoding part for control signals employs a decoding method for error correction codes used in encoding part or all of the control signals on the transmission side. The respective error detecting/decoding part for speech signals or for control signals uses a detection method corresponding to respective error detection codes applied at the transmission side.

In the following, there will be described the operation of the prior art signal identifier device. A transmission signal from the transmission side is first received. The received transmission signal is entered into the error correcting/decoding part for processing speech signals and into the error correcting/decoding part for processing control signals. The reception signal entered is decoded in response to the decoding methods of the respective error correcting/decoding parts, and is output as decoded signals. The decoded output signals are entered into the error detection/decoding parts. On the basis of the error detection code applied at the transmission side, it is inspected whether or not each decoded signal contains partly or wholly any bit errors, and a correct/false signal is generated. The signal identifier device herein receives the decoded signals and the correct/false signals and compares errors in the correct/false signals, regards, as the transmitted signal, the correct/false signal in which no error is detected, and outputs the decoded signal and the identification signal of that signal.

Although no adequate reference for the signal identifying system is knowing a detailed description of the error detection code can be found in "Encoding Theory" written by Hiroshi Miyagawa, Yoshiro Iwadare, and Hideki Imai, published by (joint-stock company) Shokodo Co.,Ltd. A set of two devices, each of which has been disclosed in "Japanese Laid-Open Patent Publication (A) No.60-144038 titled as A Digital Signal Transmission System, Matsushita Electric Industry (Co.,Ltd.), Keishi Matsuya" are applicable to the signal identifier device.

The following describes a bit error counter device in transmitter/receiver equipment for use in digital communication. A digital communication system has been recently proposed, in which an original signal is subjected to convolution encoding at the transmission side and is then transmitted to the reception side as a transmission signal, and further, at the reception side, a reception signal is Viterbi-decoded. The transmission system enables the number of bit errors to be counted from a main signal itsel,f such as a speech signal, and an image signal without transmitting a known signal from the transmission side to the reception side. A receiver can thereby determine the transmission quality of a transmission channel based on the number of bit errors counted.

The following describes a prior art bit error counter device which uses of convolutional codes and a Viterbi code.

First, the configuration of the prior art bit error counter device is described. The transmission side of the prior art bit error counter device is formed by an error correcting/ encoding part. The reception side of the prior art bit error counter device comprises an error correcting/decoding part, a delay part, a re-encoding part, and a comparator part. The error correcting/encoding part and the re-encoding part are adapted to carry out convolutional encoding of input signals, and the error correcting/decoding part is adapted to carry out Viterbi-decoding of the convolution encoded input signal. The delay part serves to delay the time of the input signal until it is processed by the error correcting/decoding part and the re-encoding part, and is entered into the comparator part. The comparator part compares the two input signals, and counts a difference of bit numbers therebetween.

The error correcting/encoding part of the transmission side carries out convolutional encoding of original input signals and outputs transmission signals. The reception side receives the transmission signals and transfers them to the delay part and the error correcting/decoding part. The error correcting/decoding part Viterbi-decodes the received input signals and outputs decoded signals. The re-encoding part receives the decoded signal, convolution-encodes the same, and outputs a re-encoded signal. The comparator part compares for every bit a delayed reception signal which is delayed in the delay part with the re-encoded signal, counts the number of difference bits therebetween, and calculates and outputs a bit error rate.

Such a technique is disclosed, for example, in the following reference: QUALCOM company, Technical Data Sheet "Q0256 K=7 MULTICODE RATE VITERBI DECODER" (1990–6) p.13, 15~16.

The prior art signal identifier device however suffers from a difficulty that it is informed only of a result of the error detection, and it fails to identify whether the transmitted signal is a speech signal or a FACCH signal when any bit error is detected in both of the speech signal and the FACCH signal or when an error, which exceeds the detection capability of the error detection code, is produced. Such a situation includes, for example, a case where a bit error is produced in any fraction of a speech signal other than an object to be error-corrected and encoded, or inversely in a case where a bit error is produced only in the error detection code and in the object to be error detected and encoded.

Further, the prior art bit error counter device assumes that no error is produced in the decoded signal, and compares the decoded signal, with a reception signal, with the former signal taken as a reference. The device therefore executes the same processing even though a bit error is produced in the decoded signal, and fails to estimate an exact bit error rate.

SUMMARY OF THE INVENTION

Accordingly, an object of the present invention is to provide a signal identifier device capable of accurate signal identification with use of an error detection result of each signal and of the number of the bit errors.

It is another further object of the present invention to provide a bit error counter device for outputting a preset bit error rate when a bit error is produced in the decoded signal.

A first aspect of the invention made to solve the above described problem provides, at a transmission side, an error correcting/encoding part for convolution-encoding an original signal and outputting a transmission signal in a transmitter/receiver device for digital communication between a transmission side and a reception side.

A first aspect of the invention further provides, at the reception side, an error correcting/decoding part for executing Viterbi-decoding of a convolutional code for a reception signal as the transmission signal is received, and outputting a decoded signal, and when, upon updating a path memory in the process of Viterbi-decoding, the number of past histories to be recorded in the path memory exceeds a set threshold, generating an overflow signal for indication of such an excess, and a state monitoring part for generating a switching instruction signal when the number of overflow signals produced in a preset time interval exceeds a set value. The invention further provides a switching part for outputting the decoded signal as is when no switching instruction signal is applied from the state monitoring part, and outputting a set bit error rate when the switching instruction signal is applied, a re-encoding part for outputting a re-encoded signal of the output from the switching part by using a convolutional encoding, a delay part for delaying the reception signal and outputting a delayed reception signal matched with the re-encoded signal in timing, and a comparator part for comparing the re-encoded signal and the delayed reception signal with each other to count the number of bit errors, and for estimating a bit error rate on the basis of the total number of inputs and outputting the same.

To further achieve the objects of the present invention, a second aspect of the invention provides, at a transmission side, an error detection code estimation part for estimating an error detection code from an original signal for each preset period, and an error correcting/encoding part for subjecting the original signal and the error detection code to convolutional encoding (or block encoding) and outputting a transmission signal, in the transmitter/receiver device for digital communication between a transmission side and a reception side.

The second aspect of the invention provides, at the reception side an error correcting/decoding part for decoding a convolutional code (or decoding a block code) in reception signals as the transmission signal is received, an error detection part for decoding the error detection code on the basis of an output from the error correcting/decoding part and outputting a decoded signal, and further outputting an error detection signal when any error is detected, and a switching part for outputting the decoded signal as is when no error detection signal is output from the error detection part while outputting a preset bit error rate when any error detection signal is outputted form the error detection part. The invention further includes a re-encoding part for convolution encoding (or block encoding) again the decoded signal from the switching part and outputting a re-encoded signal, a delay part for delaying the reception signal and outputting a delayed reception signal matched with the re-encoded signal in timing, and a comparator part for comparing the re-encoded signal and the delayed reception signal with each other to count the number of bit errors, and for estimating a bit error rate from the total number of inputs and outputting the bit error rate.

A third aspect of the invention provides a signal identifier device according to the present invention, which is to be provided on a receiver apparatus in a transmitter/receiver for use in digital communication, the receiver apparatus being interconnected with a transmitter apparatus in the transmitter/receiver through a wire or radio means.

The following relates only to a reception side with a description of the transmission side being omitted.

The receiver apparatus comprises three principal parts including a speech signal processing part, a control signal processing part, and a signal identifying part as processing means; the speech signal processing part comprising an error correcting/decoding part for receiving a reception signal and outputting a decoded signal;

an error detector part for receiving the decoded signal and outputting an error detection signal;

a re-encoding part for receiving the reception signal and outputting a re-encoded signal;

a delay part for receiving the reception signal, and delaying the reception signal by the time the reception signal received by the error correcting/decoding part is processed by the error detector part and the re-encoding part and outputting a delayed reception signal, and a comparator part for receiving the delayed reception signal and the re-encoded signal and outputting the number of errors, the control signal processing part comprising an error correcting/decoding part for receiving the reception signal and outputting a decoded signal;

an error detector part for receiving the decoded signal and outputting an error detection signal;

a re-encoding part for receiving the decoded signal and outputting a re-encoded signal;

a delay part for receiving the reception signal and outputting the reception signal by the time the reception signal received by the error correcting/decoding part is processed by the error detector part and the re-encoding part; and a comparator part for receiving the delayed reception signal and the re-encoded signal and outputting the number of errors, and the signal identifier part comprising an input part for inputting the error detection signal, the decoded signal, and the number of bit errors from the speech signal processing part and further inputting the error detection signal, the decoded signal, and the number of bit errors from the control signal processing part;

a judgment part for judging whether the reception signal is a speech signal or a control signal; and an output part for outputting an identification signal, the decoded signal, and the number of bit errors.

A fourth aspect of the invention provides a signal identifier device of the present invention, which is to be provided on the receiver apparatus of the transmitter/receiver for use in digital communication, the transmitter apparatus and the receiver apparatus of the transmitter/receiver being interconnected with each other through a wire or radio means.

In what follows, there will be described only the reception side without describing the transmission side.

The receiver apparatus comprising three principal parts such as a speech signal processing part, a control signal processing part and a signal identifier part as processing steps; the speech signal processing part comprising an error correcting/decoding part for receiving a reception signal and outputting a decoded signal and an overflow signal;

a state monitoring part for receiving the overflow signal and outputting a switching instruction signal;

a switching part for receiving the switching instruction signal and the decoded signal and outputting the switching instruction signal, the decoded signal, and the number of bit errors;

a re-encoding part for receiving the decoded signal outputted from the switching part and outputting a re-encoded signal;

a delay part for receiving the reception signal and delaying the reception signal by the time the reception signal entered into the error correcting/decoding part is processed by the state monitoring part, the switching part, and the re-encoding part, and outputting a delayed reception signal; and a comparator part for receiving the delayed reception signal and the re-encoded signal and outputting the number of bit errors, the control signal processing part comprising an error correcting/decoding part for receiving a reception signal and outputting a decoded signal and an overflow signal;

a state monitoring part for receiving the overflow signal and outputting a switching instruction signal;

a switching part for receiving the switching instruction signal and the decoded signal, and outputting the switching instruction signal, the decoded signal, and the number of bit errors;

a re-encoding part for receiving the decoded signal outputted from the switching part and outputting a re-encoded signal;

a delay part for receiving the reception signal and delaying the reception signal by the time the reception signal entered into the error correcting/decoding part is processed by the state monitoring part, the switching part, and the re-encoding part, and outputting a delayed reception signal; and a comparator part for receiving the delayed reception signal and the re-encoded signal and outputting the number of bit errors; the signal identifier part comprising an input part for receiving the switching instruction signal, the decoded signal, and the number of errors from the speech signal processing part and further receiving the switching instruction signal, the decoded signal, and the number of errors from the control signal processing part;

a judgment part for judging whether the reception signal is the speech signal or the control signal; and an output part for outputting an identification signal yielded as a result of the judgment, the decoded signal, and the number of errors.

BRIEF DESCRIPTION OF THE DRAWINGS

FIG. 3a is a flowchart illustrating the operation of the error correcting/decoding part;

FIG. 3e is a flowchart illustrating step 3 of the error correcting/decoding part;

FIG. 14 is a flowchart illustrating the operation of a signal identification processor part;

DETAILED DESCRIPTION OF THE PREFERRED EMBODIMENTS

In the following description of the present invention, variables i, m, n, and k are assumed to be an integer, respectively, and n1 to be a restriction length ("restriction length" herein implies the number of bits of input information that affects encoded bits of output signals) is assumed. It is herein assumed that these variables are adjustable, suited for standard specifications. To the present embodiment described below, the standard specification of IS54 of TIA of USA will be applied. It is further assumed that "." denotes a multiplication operator, "/" a division operator, and "$\oplus$" an exclusive OR operator.

In what follows, there is described a bit error counter device.

Figure 1:
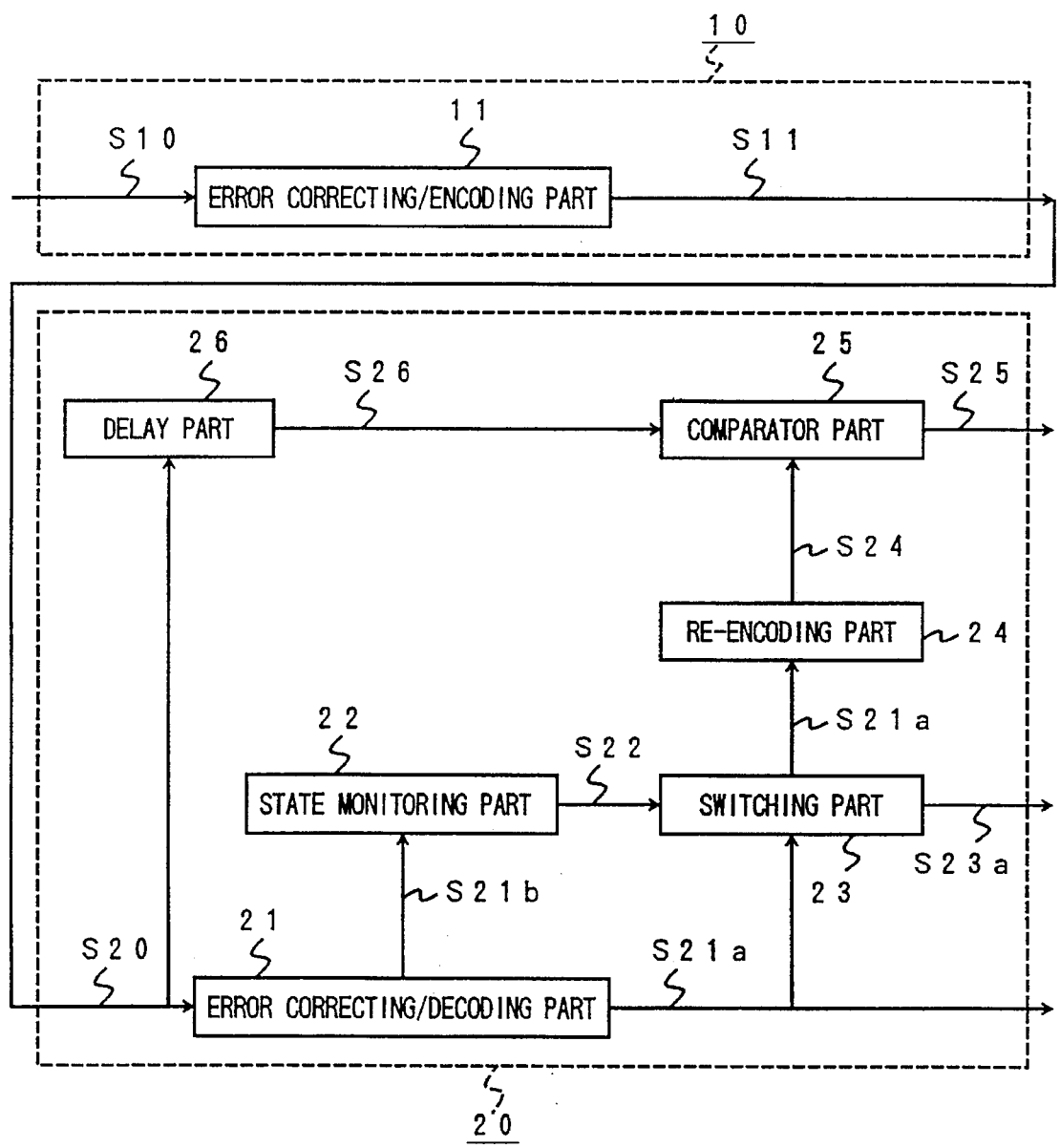
FIG. 1 is a block diagram illustrating the function of a first embodiment of a bit error counter device.

FIG. 1 is a functional block diagram illustrating the function of a bit error counter device of the first embodiment of the present invention. The bit error counter device is to be provided on a transmitter apparatus 10 and a receiver apparatus 20 of transmitter/receiver equipment for use in digital communication, the transmitter apparatus 10 and the receiver apparatus 20 being interconnected with each other through a wire or radio means.

The transmitter apparatus 10 comprises an error correcting/encoding part 11 for receiving an original signal S10 and outputting a transmission signal S11.

The receiver apparatus 20 comprises:

an error correcting/decoding part 21 for receiving a reception signal S20 and outputting a decoded signal S21$a$ and an overflow signal S21$b$;

a state monitoring part 22 for receiving the overflow signal S21$b$ and outputting a switching instruction signal S22;

a switching part 23 for receiving the switching instruction signal S22 and the decoded signal S21$a$ and outputting the decoded signal S21$a$ and the bit error rate S23$a$;

a re-encoding part 24 for receiving the decoded signal S21$a$ outputted from the switching part 23 and outputting a re-encoded signal S24;

a delay part 26 for receiving the reception signal S20 and outputting a delayed reception signal S26; and a comparator 25 for receiving the delayed reception signal S26 and the re-encoded signal S24 and outputting the bit error rate S25.

In what follows, there is exemplarily described the detailed construction or the operation of the respective parts, referring to the attached flowcharts.

The transmitter apparatus 10 is first described.

Figure 2:
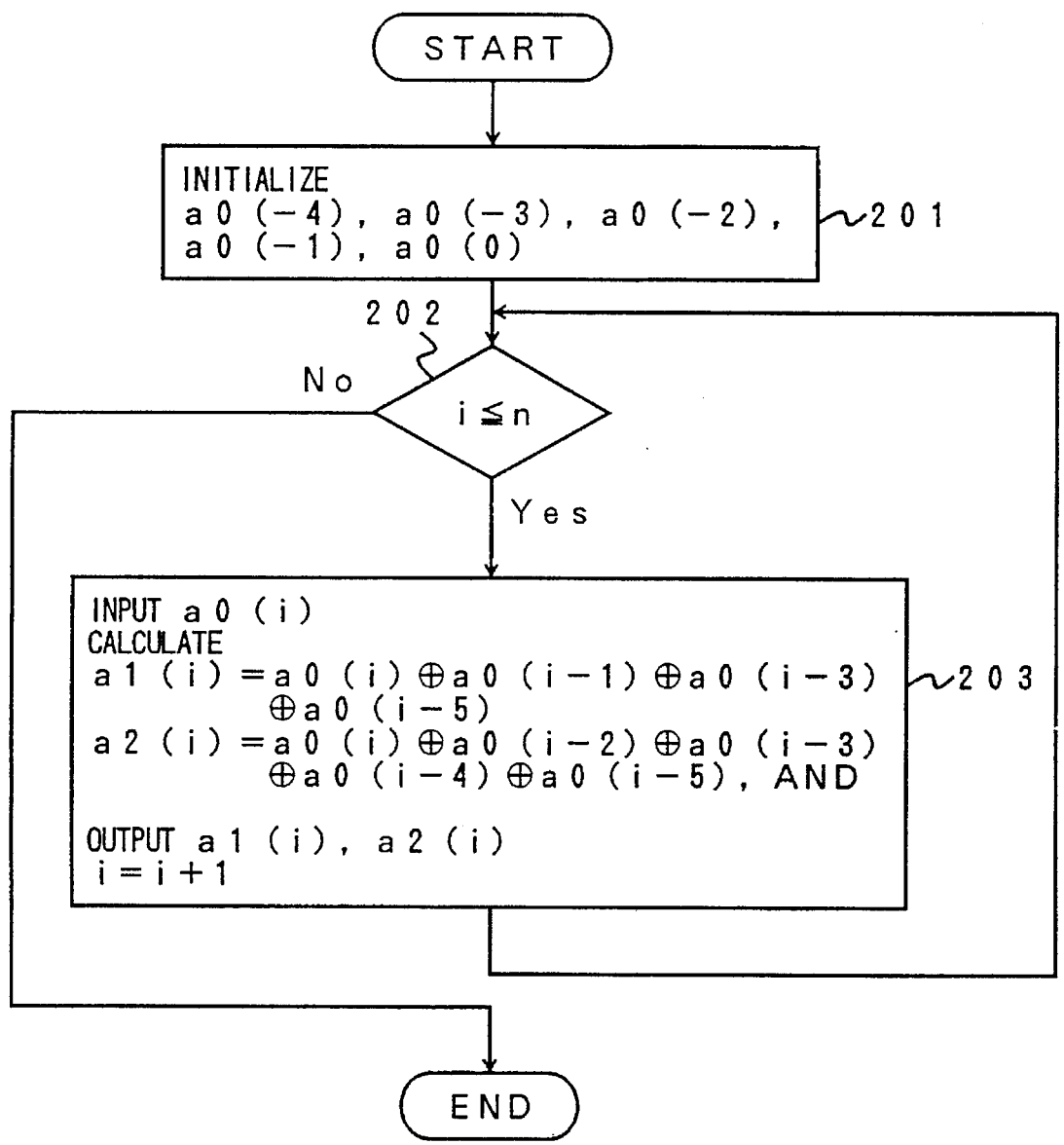
FIG. 2 is a flowchart illustrating the operation of an error correcting/encoding part.

The error correcting part 11 comprises an initializing part for executing initialization of a computation region for executing convolution-encoding of the input original signal S10, and a convolution-encoding part for convolution-encoding the input original signal S10 and outputting the transmission signal S11. Successively, the operation of the error correcting/encoding part 11 is exemplarily described by reference to the flowchart of FIG. 2.

A data format of the input signal is assumed to be a0(1), a0(2), . . . , a0(n), and a data format of the output signal to be a1(1), a2(1), a1(2), a2(2), . . . , a1(n), a2(n).

In the first place, a0(−4), a0(−3), a0(−2), a0(−1), a0(0) are initialized (step 201). 0 (zero) is entered usually for initialization. Step 203 is repeated in the range of $1 \leq i \leq n$. i is assumed to have been rendered to initial setting. In step 203, a0(i) is inputted to calculate $$a1(i)=a0(i) \oplus a0(i-1) \oplus a0(i-3) \oplus a0(i-5),$$

$$a2(i)=a0(i) \oplus a0(i-2) \oplus a0(i-3) \oplus a0(i-4) \oplus a0(i-5),$$

and outputs a1(i), a2(i). Thereafter, i is incremented by 1 and the operation advances to step 202. In step 202, if $i \leq n$ is judged, then the like processing is repeated, while i>n is judged to be satisfied, then the processing is completed. $\oplus$ denotes an exclusive OR operation.

In the receiver apparatus 20, the error correcting/decoding part 21 comprises an initializing part for initializing data required for Viterbi-decoding, an input part for receiving the reception signal S20, a step 1 for branch metric operation, ACS operation, path information determination, overflow control of a path memory, a step 2 for executing path convergence when the path memory is judged not to overflow, a step 3 for outputting the overflow signal S21$a$ when the path memory is judged to overflow, a maximum likelihood metric estimating part for estimating a maximum likelihood metric, a step 4 for determining a decoded value, and an output part for outputting the decoded signal S21$a$. Successively, there is exemplarily described the operation of the error correcting/decoding part 21 with reference to the flowcharts of FIGS. 3$a$, 3$b$, 3$c$, 3$d$, 3$e$, and 3$f$. A trellis diagram and Viterbi-decoding cited in the present description are exemplarily illustrated in FIG. 3$g$.

In step 301, there are set i=1, t=2, s2(im)=0, j=0, PM(im, 1)=im ($0 \leq im \leq 2^{nl-1}-1$ is assumed.) for initialization. Then, a1'(i), a2'(i) are inputted (step 302), and $m \leq 2^{nl-1}-1$ is judged to be satisfied (step 303). If $m \leq 2^{nl-1}-1$ is judged to be satisfied, then s1(m)=s2(m) is set (step 304) while if $m<2^{nl-1}-1$ is judged to be satisfied, then the processing is completed. $0 \leq im \leq 2n^{nl-1}-1$ is assumed as described above, and im has previously been initialized to 0 and is incremented by +1 when step 303 is completed. Successively, there will be described the operation of the step 1 which executes branch metric operation, ACS operation, path information determination with reference to the flowcharts of FIGS. 3$b$ and 3$c$. Step 305 is to execute the branch metric operation, i.e., execute equations given below $$x=a1'(i) \oplus b1(m,k0)+a2'(i) \oplus b2(m,k0)$$

$$y=a1'(i) \oplus b1(m,k1)+a2'(i) \oplus b2(m,k1)$$

which is to calculate a Hamming distance (branch metric) between input signals a1'(i), a2'(i), and branch metrics b1(m,k0), b2(m,k0), b1(m,k1), b2(m,k1). In this case, the calculation may be of the sum of products type. Steps 306 to 308, and step 312 are those of executing ACS (Add Compare Select) operation. First at step 306, a present branch metric (x,y) is added to a previous branch metric (s1(k0),s1(k1)). The processing just-mentioned is executed by equations given below.

$$s_x=s1(k0)+x$$

$$s_y=s1(k1)+y$$

Successively, sx and sy calculated in step 306 are compared (step 307), and if $s_x \leq s_y$ is judged to be satisfied, then s2(m)=$s_x$ is set in step 308, while if $s_x>s_y$ is judged, then s(m)=sy is set in step 312. Steps 309 to 311, and steps 313 to 315 are those of achieving the path information determination. First, after step 308 is completed, a survivor k0 (there remains only one path reaching the respective states) is inserted into a path memory PM(m,t)(step 309), and PM(k0, im) is inserted into a work memory WM(m,im) in the range of $1 \leq im \leq t-1$ (steps 310 and 311). In contrast, after step 312 is completed, a survivor k1 is inserted into the path memory PM(m,t)(step 313), and PM(k1,im) is inserted into the work memory WM(m,im) in the range of $1 \leq im \leq t-1$ (steps 314 and 315). Herein, im has previously been initialized to 1, and after steps 310 and 314 are done it is incremented by +1. Successively, in the ranges of $0 \leq im \leq 2^{nl-1}$ (step 316) and of $1 \leq it \leq t-1$, PM(im,it)=WM(im,it) is executed (step 318). Herein, im and it have previously been initialized to 1, and after step 316 or 317 is done, they are incremented by +1. It should be noted that, though in the step 1 the processing was done with use of the exclusive OR operation, the same effect could be expected with use of the operation of the sum of products. In that case, in step 305, there are calculated $$x = a1'(i) \times b1(m,k0) + a2'(i) \times b2(m,k0)$$

$$y = a1'(i) \times b1(m,k1) + a2'(i) \times b2(m,k1).$$

Further, in step 307, $s_x \leq s_y$ is judged to be satisfied, and if it is so, when the processing advances to step 308, while if $s_x < s_y$ is judged, then the processing advances to step 312, and thereafter the same processing is repeated.

Successively, in step 319 (shown in FIG. 3a), t=t+1 is executed, and $t \geq m1$ is judged to be satisfied (step 320). If t<m1 is judged, then the step 2 is executed, while t->m1 is judged, then the step 3 is executed. Herein, m1 denotes a path memory length.

Figure 3B:
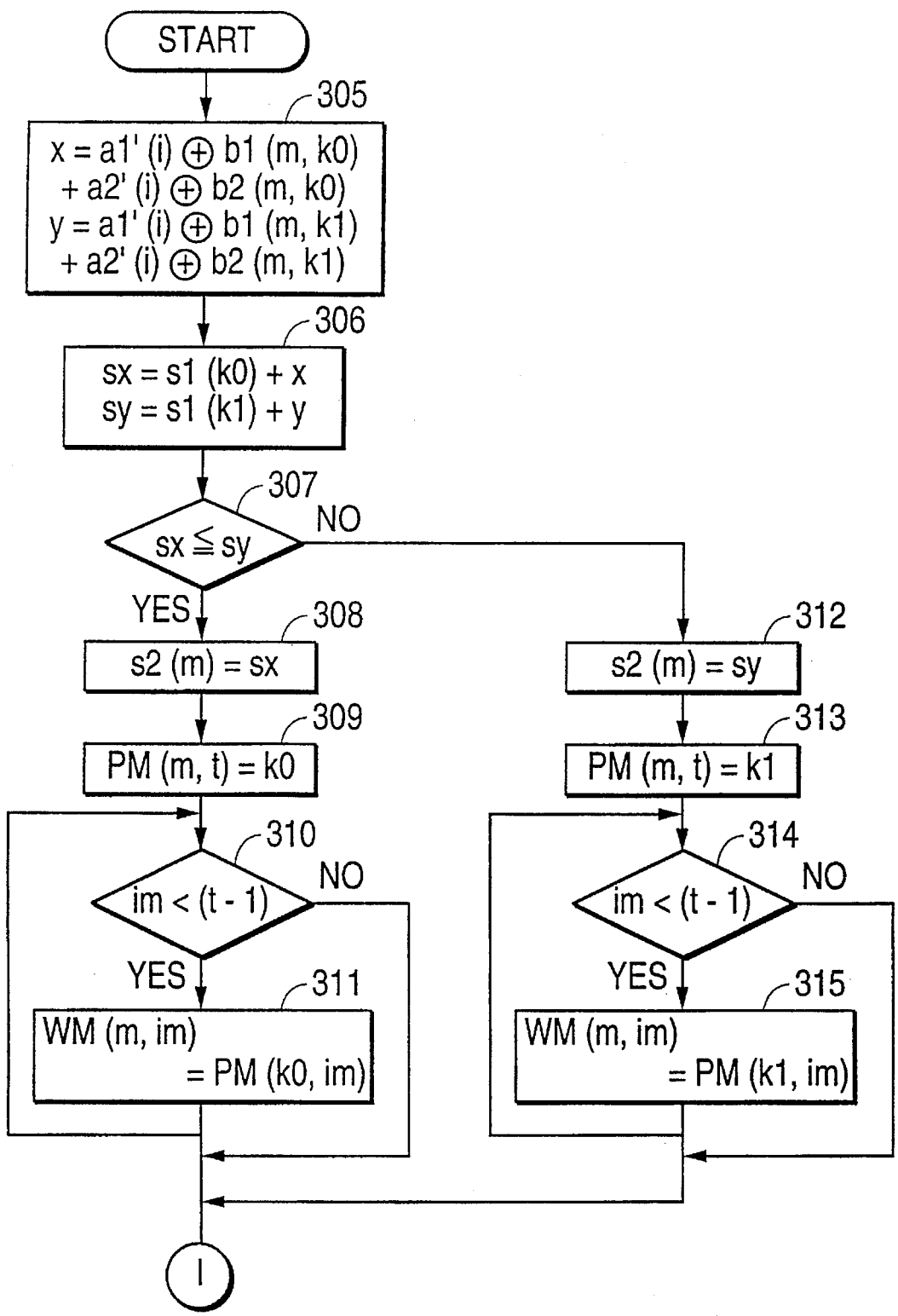
FIG. 3b is a flowchart illustrating the operation of step 1 of the error correcting/decoding part.
Figure 3C:
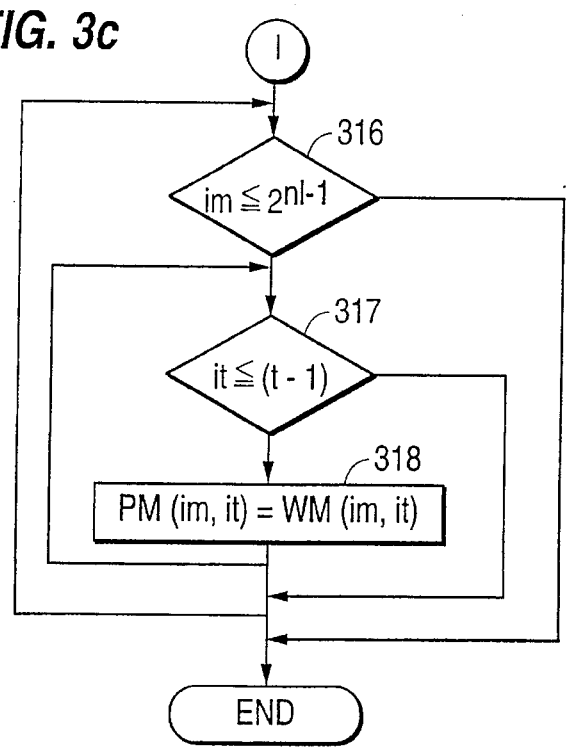
FIG. 3c is a flowchart further illustrating the operation of step 1 of the error correcting/decoding part.

Successively, there will be described the operation of the step 2 in which oath convergence is executed after the path memory is judged not to overflow with reference to the flowchart of FIG. 3d. This is the case where the path memory is judged not to overflow in step 320. More specifically, in the range of $1 \leq m \leq 2^{n1-1}-1$, an equation $$PM(m,1)=PM(0,1)$$

is judged (step 321), and if all of the aforementioned equations are satisfied, step 323 to 330 are executed, while if even any one of the aforementioned equations is not satisfied, the processing is terminated. Steps 323 to 330 are described below. Step 323 is a step for determining a decoded value, in which $PM(0,1) \geq 2^{n1-2}$ is judged to be satisfied (step 323), and if $PM(0,1) \geq 2^{n1-2}$ is judged to be satisfied, then 1 is inserted into a0'(j) (step 324), while $PM(0,1) < 2^{n1-2}$ is judged to be satisfied, then 0 is inserted into a0'(j) (step 325) to determine a decoded value a0'(j). j is incremented by +1 (step 326). Successively, there will be described steps 327 to 329 where processing is made of shifting the path memory. An equation PM(m,it)=PM(m,it+1) is executed (step 329) within the range of $0 \leq m \leq 2^{n1-1}-1$ (step 327) and within the range of $1 \leq it \leq t-1$ (step 328). And t=t-1 is executed (step 330), and the processing returns to step 321 for the identical processing to those described above.

In the following, there is described the operation of a step 4 with reference to the flowchart of FIG. 3e, in which step 4 the overflow signal S21a is outputted after the path memory is judged to overflow. In step 320 the path memory is judged to overflow, and the overflow signal S21a is outputted (step 331). Steps 332 to 335 are to evaluate a maximum likelihood metric. There is first executed initialization $M_{m1}=0$, $S_{min}=S1(0)$ to evaluate the maximum likelihood metric (step 332). Then, $s1(m)<S_{min}$ is judged (step 334) to be satisfied within the range of $1 \leq m \leq 2^{n1-1}-1$ (step 333), and if it is judged to be so, then $M_{m1}=m$, $S_{min}=S1(m)$ is executed (step 335), while it not so, then the processing returns to step 333. Further, when $m > 2^{n1-1}-1$ is judged to hold in step 333, then the processing advances to step 336. Steps 336 to 338 are those of determining a decoded value. In step 336, $PM(M_{m1},1) \geq 2^{n1-2}$ is judged to be satisfied, and if it is judged to be so, then 1 is inserted into a0'(j) (step 337), while if $PM(M_{m1},1) < 2^{n1-2}$ is judged to be satisfied, then 0 is inserted into a0'(j) (step 338). Further, in step 339 j=j+1 is set. Successively, there will be described steps 340 to 342 to execute the processing of shifting the path memory. This is to execute the identical processing to that of steps 327 to 329. More specifically, an equation PM(m,it)=PM(m,it+1) is executed (step 342) in the range of $0 \leq m \leq 2^{n1-1}-1$ (step 340) and in the range of $1 \leq it \leq t-1$ (step 341). Further, t=t-1 is set (step 343), and the processing is terminated.

Successively, in step 344 (illustrated in FIG. 3a) i=i+1 is set, and i>n is judged to be satisfied (step 345). If $i \leq n$ is judged to be satisfied, then the processing of from step 302 are repeated, while if i>n is judged, then the processing advances to step 346 to evaluate a maximum likelihood metric. The evaluation of the maximum likelihood metric is done in the same manner as the processing of from step 332 to step 335 (illustrated in FIG. 3e).

Figure 3F:
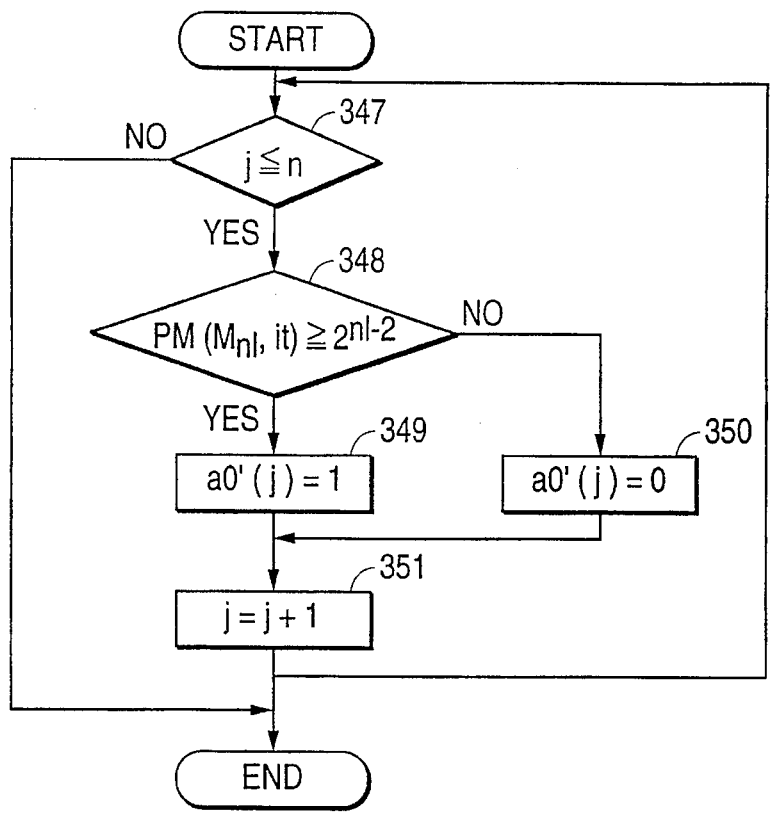
FIG. 3f is a flowchart illustrating the operation of step 4 of the error correcting/decoding part.
Figure 3D:
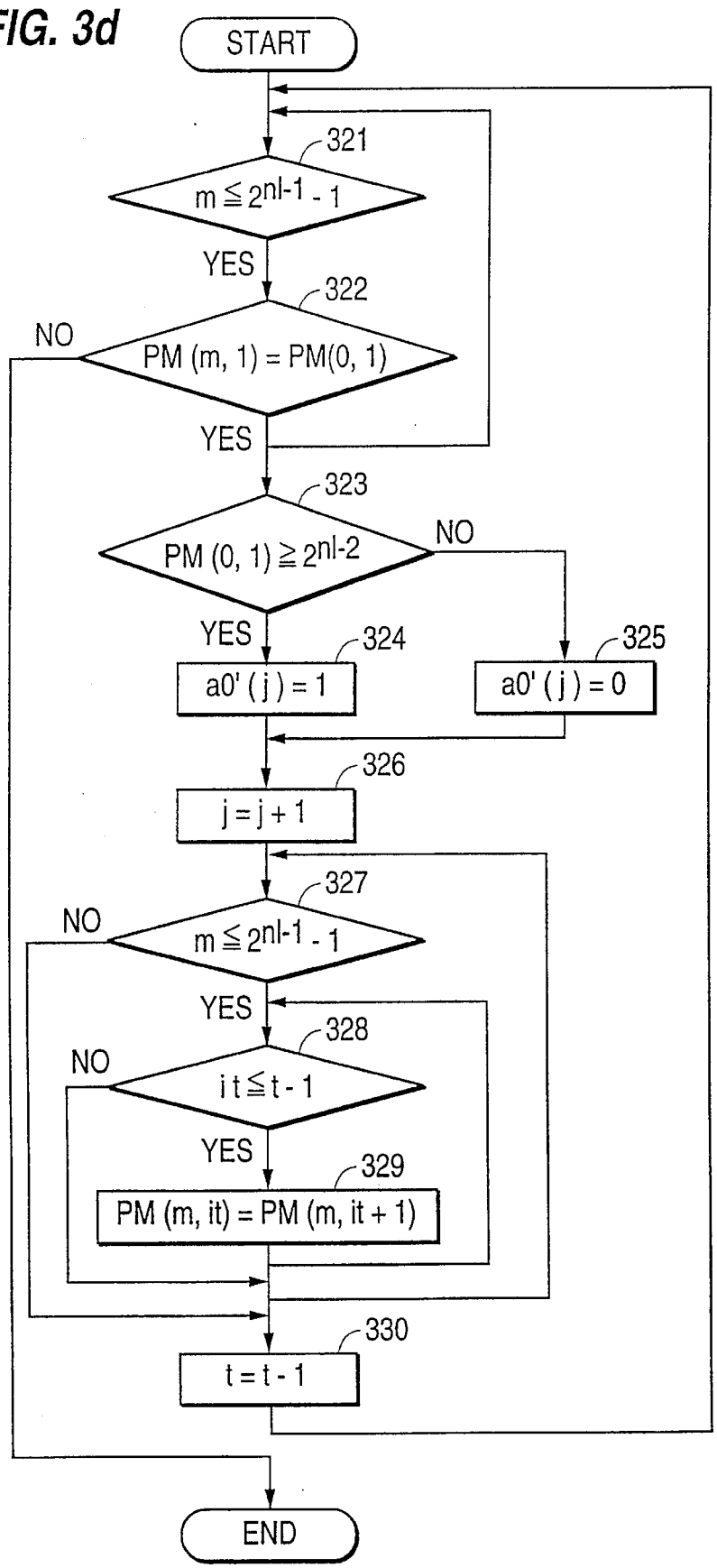
FIG. 3d is a flowchart illustrating the operation of step 2 of the error correcting/decoding part.
Figure 3G:
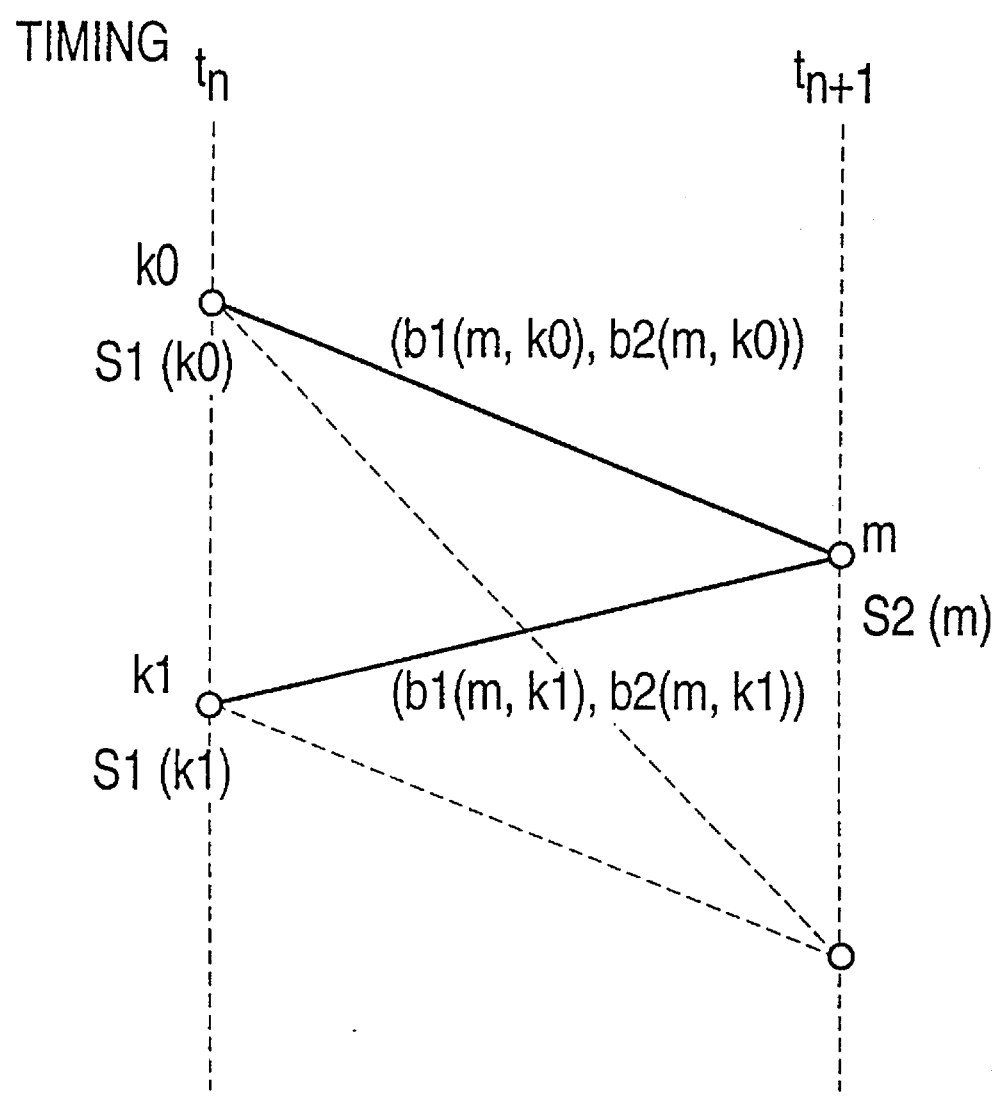
FIG. 3g is a trace diagram and an exemplarily view illustrating the operation state of Viterbi-decoding.

Successively, there will exemplarily be described the operation of the procedure 4 to determine the decoded value with reference to the flowchart of FIG. 3f. Within the range of $j \leq n$ (step 347), $PM(M_{m1},it) \geq 2^{n1-2}$ is judged to be satisfied (step 348). In this case, it varies in the range of $1 \leq it \leq n-(j-1)$ with respect to j at the time of starting of the procedure 4. If $PM(M_{m1},it) \geq 2^{n1-2}$ is judged to be satisfied, then 1 is inserted into a0'(j) (step 349), while if $PM(M_{m1},it) < 2^{n1-2}$ is judged to be satisfied, then 0 is inserted into a0'(j) (step 350). Further, j=j+1, it=it+1 are set (step 351), and the processing returns to step 347. If j>n is thereupon judged, then the processing is terminated. Further, in step 352 (illustrated in FIG. 3a), a0'(1), ..., a0'(n) are outputted and the processing is terminated.

Figure 4:
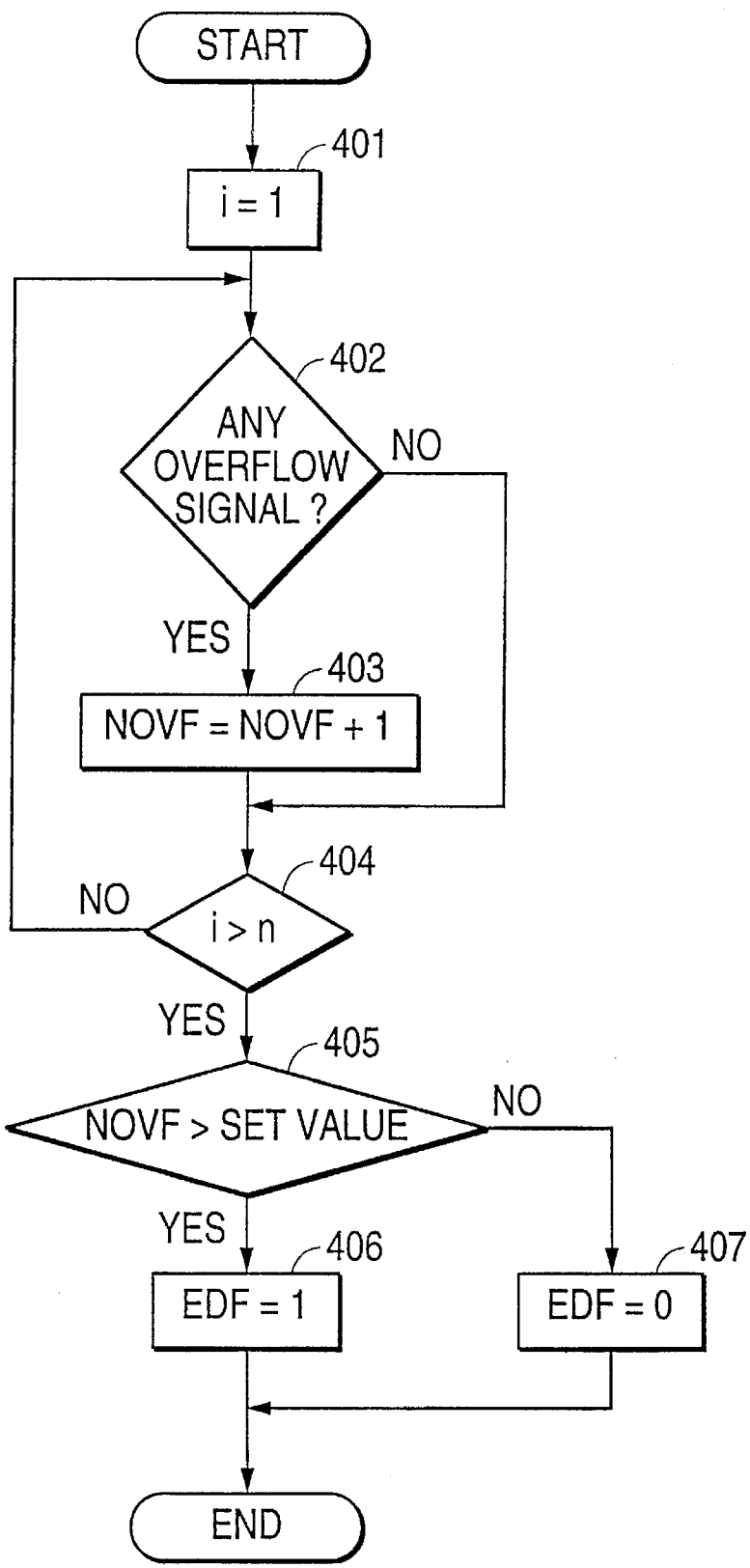
FIG. 4 is a flowchart illustrating the operation of a state monitoring part.

The state monitoring part 22 comprises an overflow signal identifying part for judging whether or not the overflow signal S21b is inputted, and a switching instruction signal output part for monitoring the overflow signal S21b and outputting a switching instruction signal S22. In the following, there will exemplarily described the operation of the state monitoring part 22 with reference to the flowchart of FIG. 4.

In the first place, 1 is substituted for i for initialization (step 401). Then, it is judged whether or not the overflow signal S21b is inputted from the error correcting/decoding part 21 (step 402), and if the overflow signal S21b is judged to be inputted, then a counter NOVF for the overflow signal S21b is incremented by +1 (step 403), and in step 404 the same processing is repeated until i>n is judged to be satisfied. If i>n is judged in step 404, then a set value which has been preset is compared with the counter NOVF (step 405). If the contents in the counter NOVF are judged to be greater than the set value, then 1 is inserted into the switching instruction signal EDF and a switching instruction signal EDF is outputted (step 406), and otherwise 0 is inserted into the switching instruction signal EDF which is in turn outputted (step 407) to terminate the processing.

Figure 5:
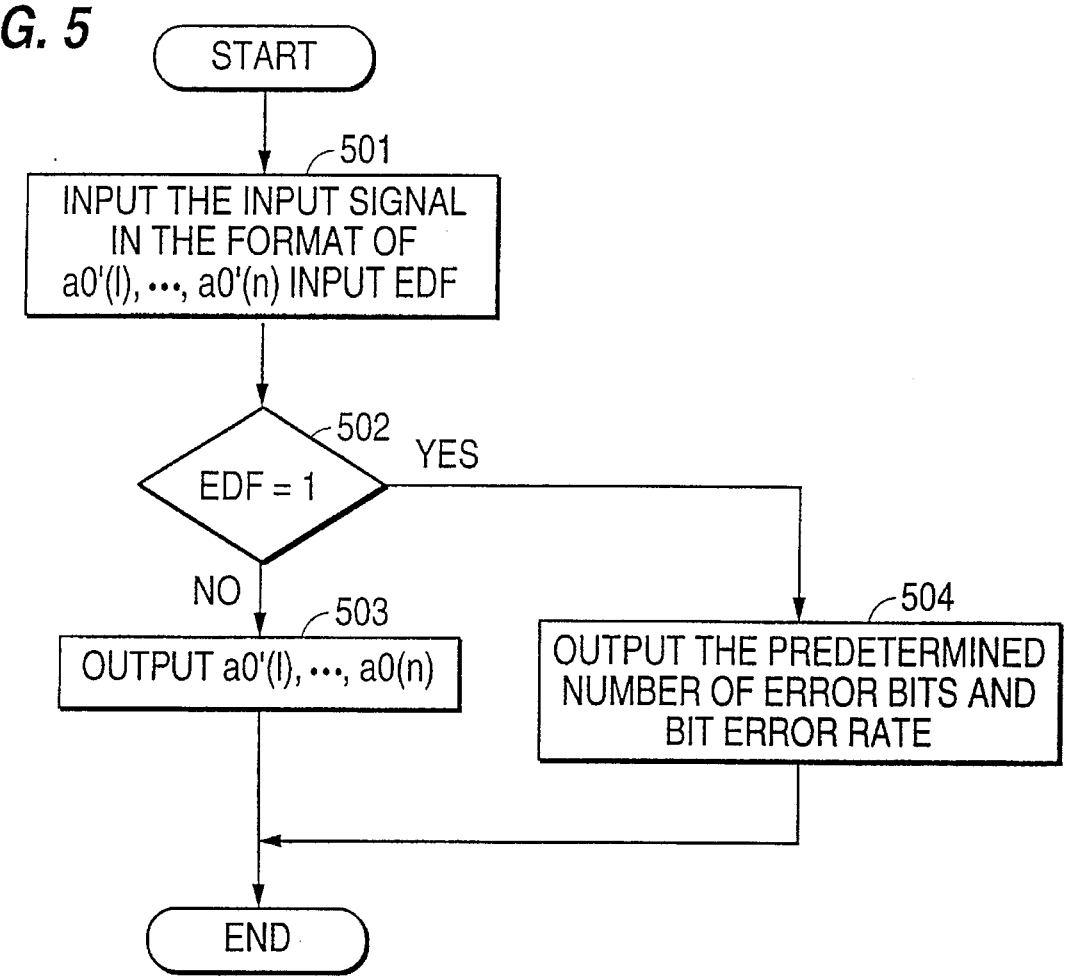
FIG. 5 is a flowchart illustrating the operation of a switching part.

The switching part 23 comprises a data input part for receiving the decoded signal S21a and the switching instruction signal S22, a decoded signal output part for outputting the decoded signal S21a, and a set value output part for outputting the set number of errors and the set error rate. Successively, there will be described the exemplarily operation of the switching part 23 constructed as above with reference to the flowchart of FIG. 5. First, the decoded signal S21a is inputted in the format of a0'(1), ..., a0'(n), and the switching instruction signal S22 EDF is inputted (step 501), and the foregoing switching instruction signal S22EDF satisfies EDF=1 (step 502). With EDF=0, the input decoded signal S21a is outputted intact (step 503), while with EDF=1, there are outputted the number of errors and the bit error rate, which have been preset to between 0 and 50%, respectively (step 504).

The re-encoding part 24 possesses the identical construction to that of the error correcting/encoding part 11, and is assumed to be means for re-encoding an input signal with the aid of the same encoding means as the error correcting/encoding part 11.

Figure 6A:
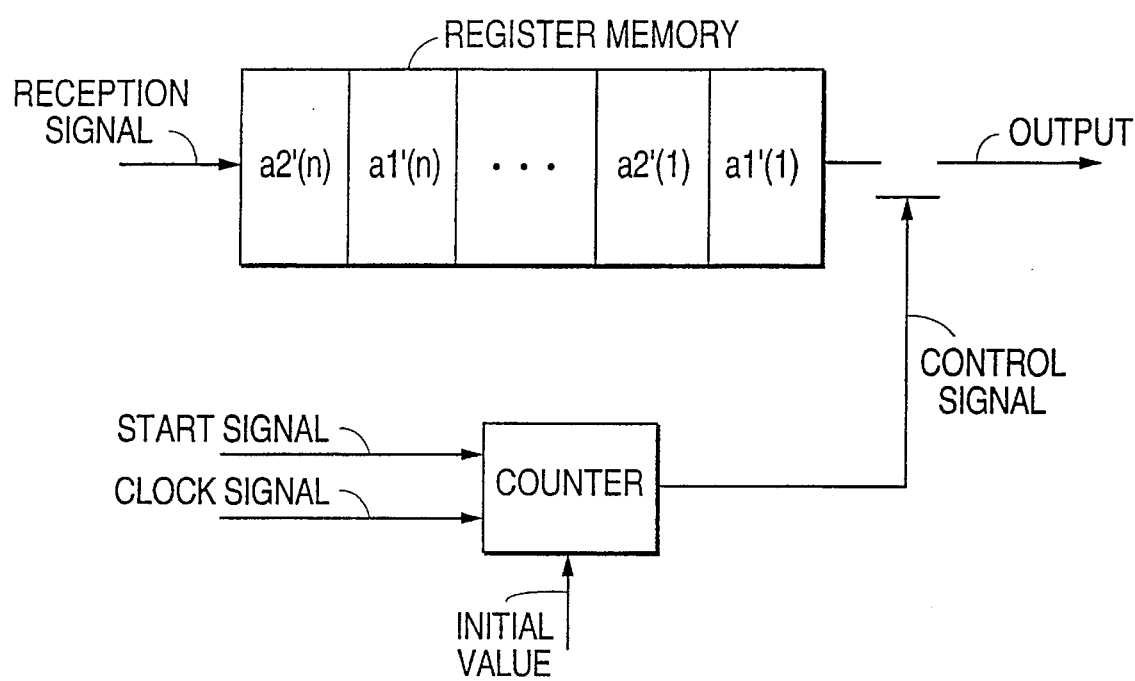
FIG. 6a is a detailed functional block diagram illustrating the operation of a delay part.
Figure 6B:
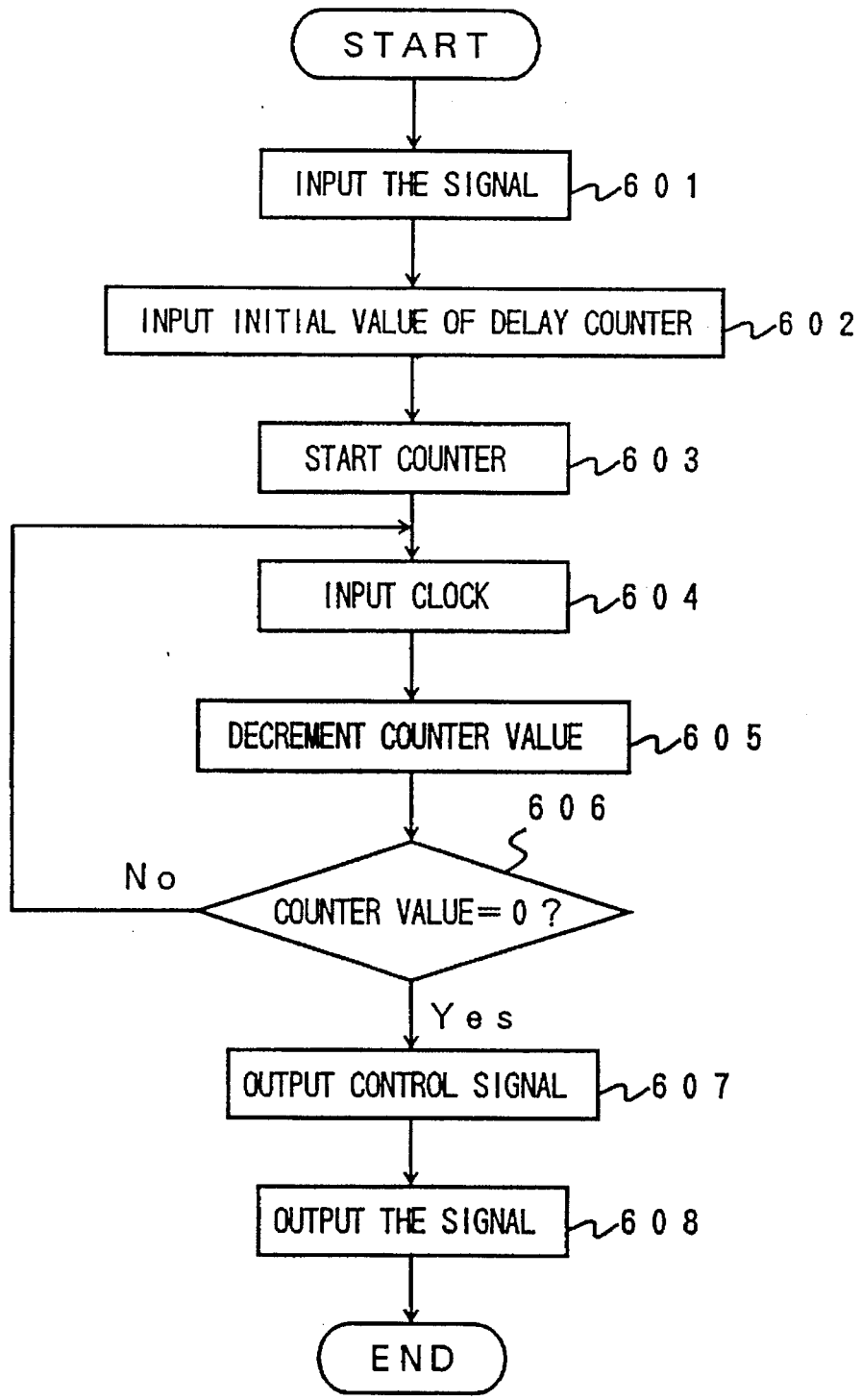
FIG. 6b is a flowchart illustrating the operation of the delay part.

The delay part 26 comprises a delay counter initial value input part for inputting an initial value of the delay counter; a counter part for a executing delay operation with the aid a counter; and a signal output part for outputting the delayed reception signal S26. There will be described the exemplarily operation of the delay part 26 with reference to the block diagram illustrating the detailed function of FIG. 6a and to the flowchart of FIG. 6b.

In the first place, the reception signal S20 is inputted (step 601). Then, there is outputted a counter value which has been preset and corresponds to the time to be delayed this time (step 602), and the counter is started (603). The counter value is a value to delay the reception signal S20 inputted into the delay part 26 by the time during which the reception signal S20 is processed through the error correcting/decoding part 21, the state monitoring part 22, the switching part 23, the re-encoding part 24, and the comparator part 25. Then, a clock signal is inputted (step 604), and the counter value is decremented only by one each time the clock signal is inputted (step 605). This is repeated until the counter value reaches 0 (zero) for execution of steps 604 and 605 (step 606). In step 606, if the counter value is judged to be 0 (zero), then the counter part issues a control signal (step 607) to output the reception signal S20 (step 608), and the processing is terminated.

Figure 7A:
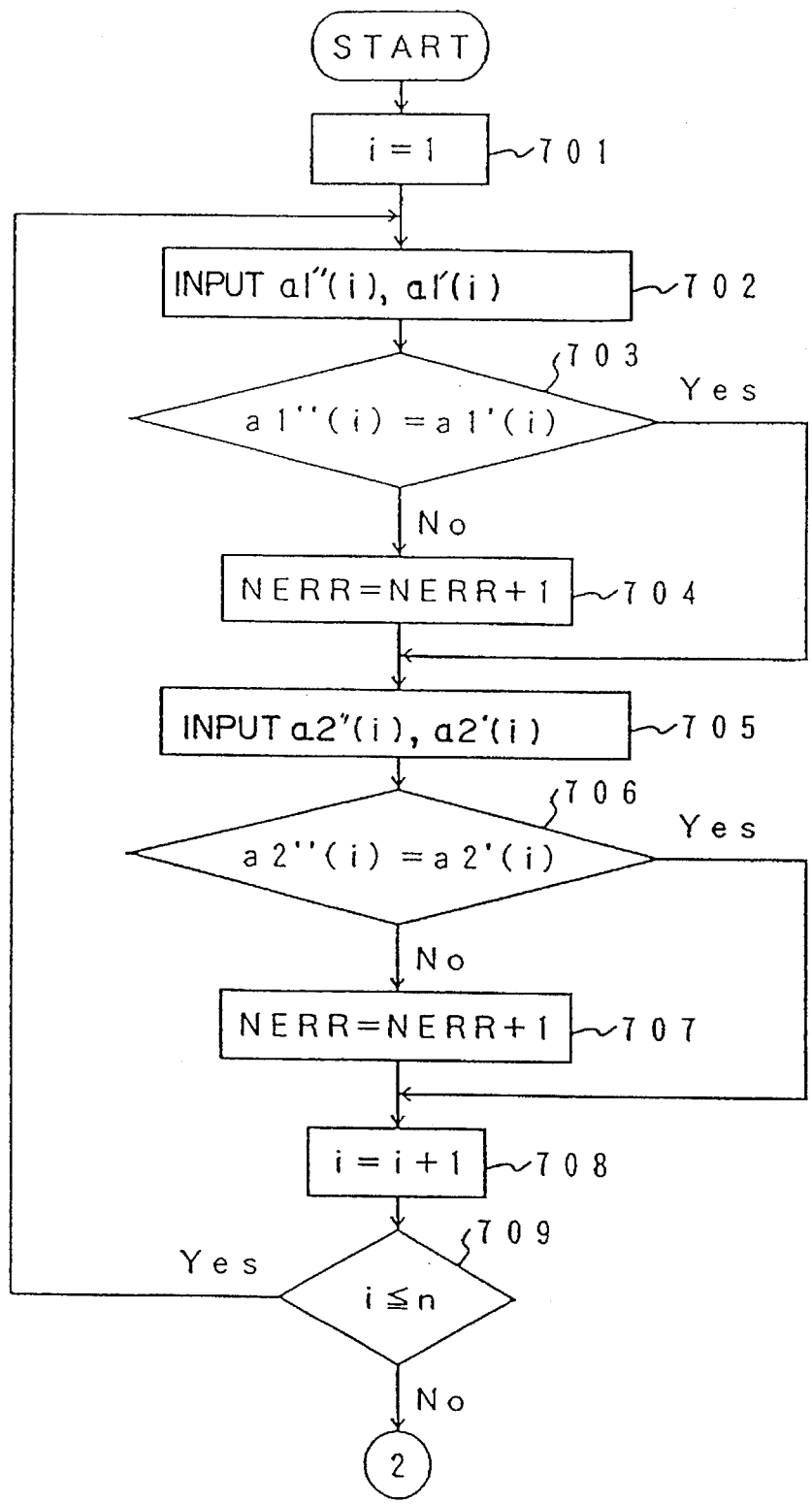
FIG. 7a is a flowchart illustrating the operation of a comparator part.
Figure 7B:
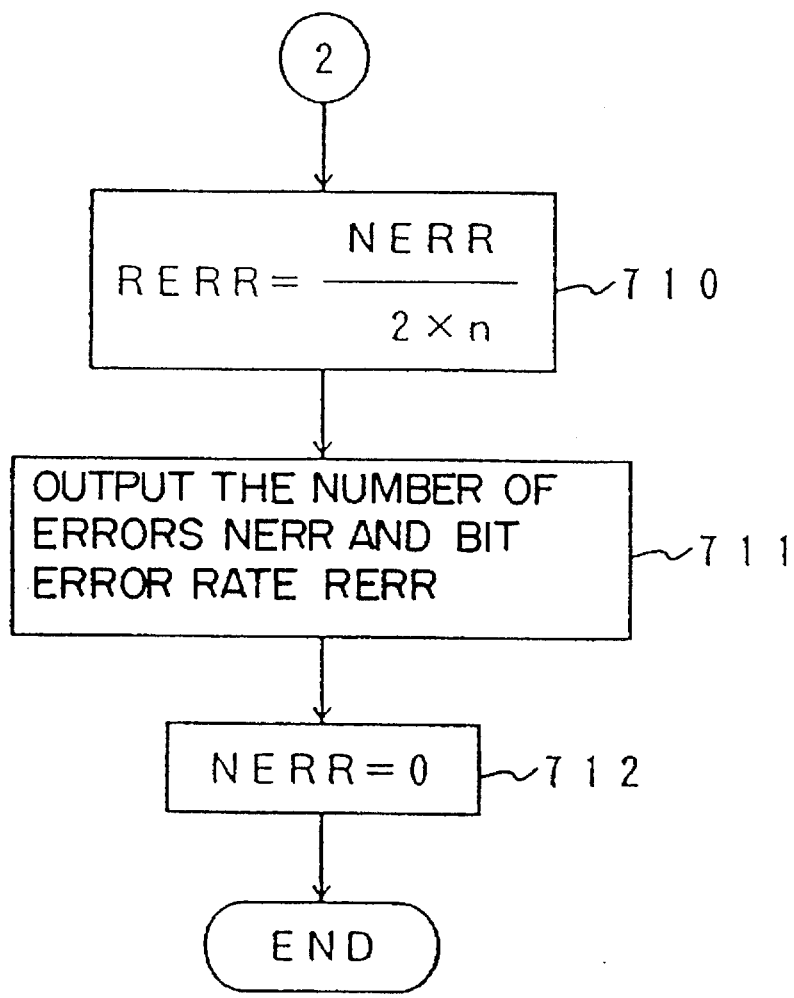
FIG. 7b is a flowchart further illustrating the operation of the comparator part.

The comparator part 25 comprises a bit comparator part for comparing the delayed reception signal S26 and the re-encoded signal S24 with each other for every bit, and bit error rate evaluation part for evaluating the error rate S25. Successively, there will be described the exemplarily operation of the comparator part 25 with reference to the flowcharts of FIG. 7a and 7b. A data format when the delayed reception signal S26 is inputted is assumed to be $$a1'(1), a2'(1), \ldots, a1'(n), a2'(n),$$

and a data format when the re-encoded signal S24 is inputted is assumed to be $$a1''(1), a2''(1), \ldots, a1''(n), a2''(n).$$

First, 1 is inserted into i (step 701). Then, a1'(i) and a1''(i) are inputted (step 702), and whether a1'(i)=a1''(i) is judged (step 703). If a1'(i)≠a1''(i) is judged to be satisfied, then NERR=NERR+1 is executed (step 704) and step 705 is executed, while if a1'(i)=a1''(i) is judged to be satisfied, then no processing is executed and step 705 is executed.

Successively, a2'(i) and a2''(i) are inputted (step 705), and whether a2'(i)=a2''(i) is judged to be satisfied (step 706). If a2'(i)≠a2''(i) is judged to be satisfied, then NERR=NERR+1 is executed (step 707) and step 708 is executed while if a1'(i)=a1''(i) is judged to be satisfied, then no processing is executed and step 708 is executed. Further, i=i+1 is executed (step 708), and whether n≦i is judged in step 709. Herein, if i≦n is judged to be satisified, then the processing from step 702 to step 708 is repeated, while if i>n is judged, then the bit error rate RERR is evaluated by dividing the number of errors NERR by a number yielded doubling n in step 710. Further, the number of errors NERR and the bit error rate RERR are outputted (step 711), and 0 (zero) is inserted into the number of errors NERR (step 712).

Successively, there will be described a second embodiment of the bit error counter device.

Figure 8:
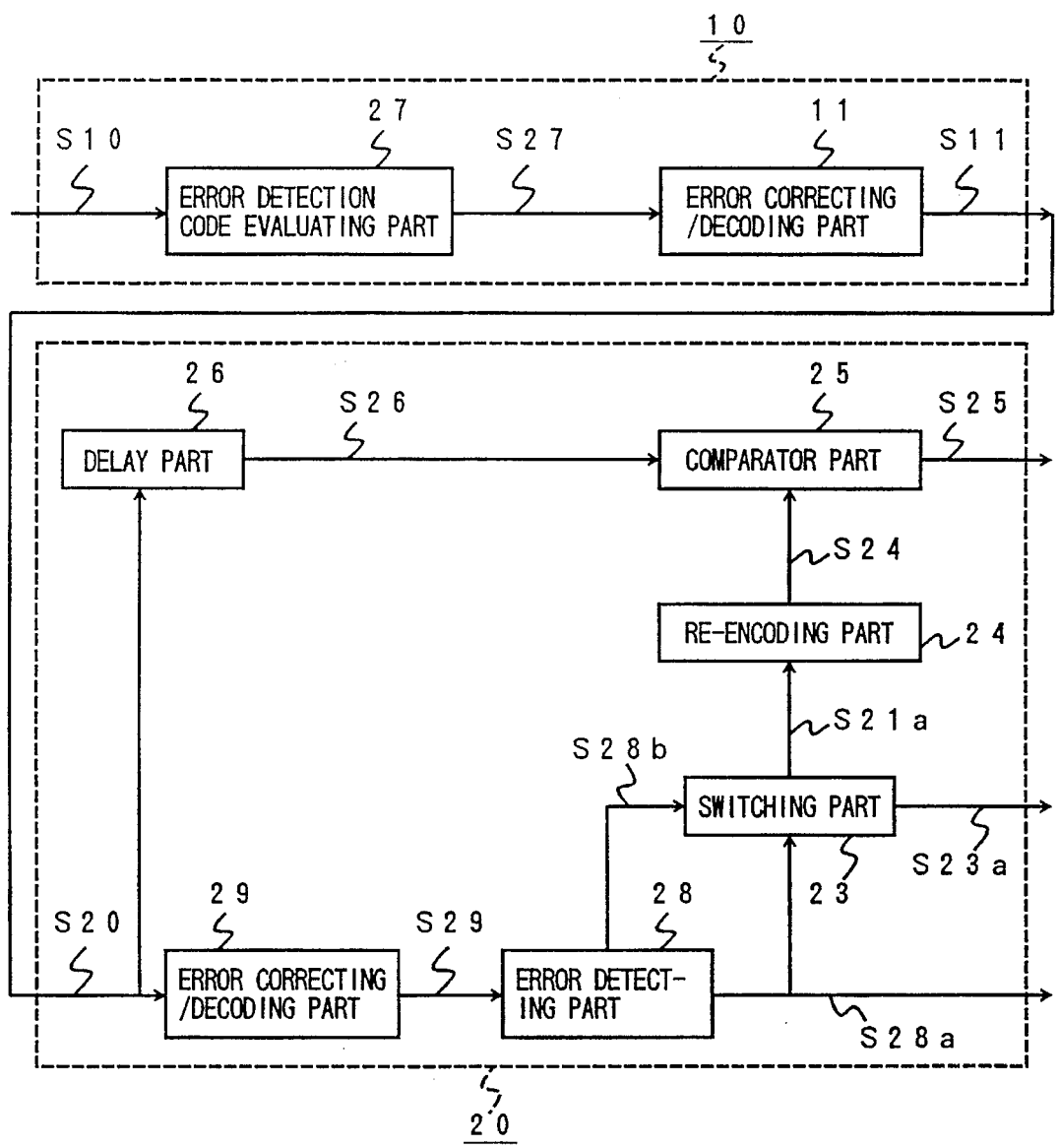
FIG. 8 is a block diagram illustrating the function of a second embodiment of the bit error counter device.

Referring to FIG. 8, there is schematically illustrated in the form of a block diagram of a bit error counter device of the second embodiment of the present invention. The bit error counter device is to be provided on the transmitter apparatus 10 and on the receiver apparatus 20 in the transmitter/receiver equipment used in digital communication as described in the first embodiment.

The transmitter apparatus 10 comprises:

an error detecting code evaluating part 27 for receiving an original signal S10 and outputting an evaluation result S27 of an error detecting code, and an error correcting/encoding part 11 for receiving the foregoing evaluation result S27 of the error detecting code and outputting a transmission signal S11.

The receiver apparatus 20 comprises:

an error correcting/decoding part 29 for receiving a reception signal S20 and outputing a decoded signal S29, an error detecting part 28 for receiving the decoded signal S29 and outputting a decoded signal S28a and an error detecting signal S28b, a switching part 23 for receiving the decoded signal S28a and the error detecting signal S28b, and outputting the decoded signal S21a and the bit error rate S23a, a re-encoding part 24 for receiving the decoded signal S21a and outputting a re-encoded signal S24, a delay part 26 for receiving the reception signal S20 and outputting a delayed reception signal S26, and a comparator part 25 for receiving the delayed reception signal S26 and the re-encoded signal S24, and outputting the bit error rate S25.

In the following, there will be described the exemplarily construction and operation of detailed portions of the device with reference to the flowcharts.

There will first be described the transmitter apparatus 10.

Figure 9:
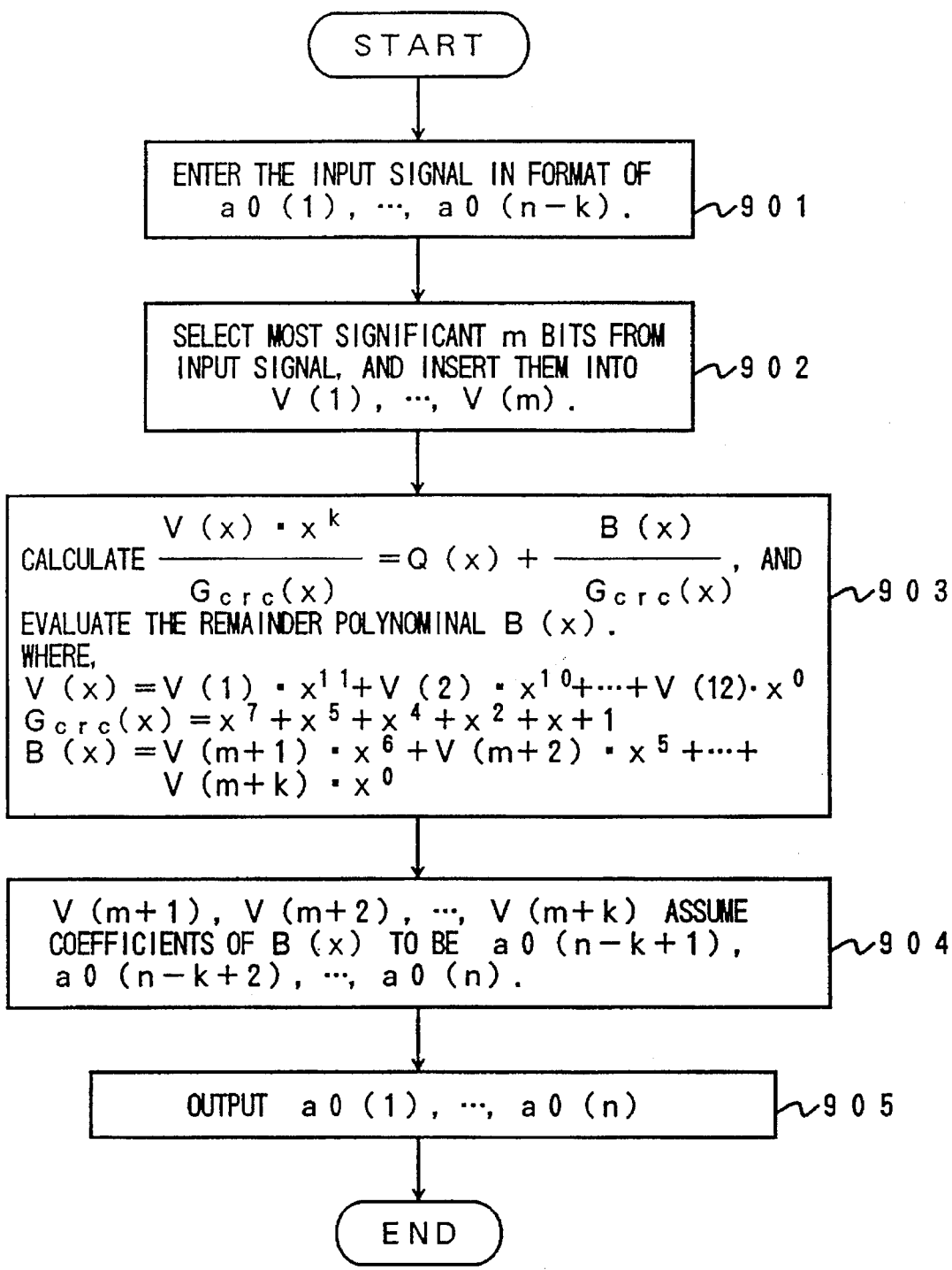
FIG. 9 is a flowchart illustrating the operation of an error detecting code estimation (evaluating) part.

The error detection code evaluating part 27 of the transmitter apparatus 10 comprises a bit selection part for selecting most significant m bits from the input signal, and an encoding part for calculating an equation $$V(x).x^k/G_{crc}(x)=Q(x)+B(x)/G_{crc}(x),$$

and evaluating a remainder polynomial B(x). Successively, there will be described the exemplarily operation of the error detection code evaluating part 27 with reference to the flowchart of FIG. 9.

The format of the input signal is herein assumed to be $$a0(1), a0(2), \ldots, a0(n-k),$$

and the format of the output signal is assumed to be $$a0(1), a0(2), \ldots, a0(n-k), \ldots, a0(n).$$

It should be noted that the present embodiment is desired to correspond to the standard specification of IS54 of US.TIA, so that m=12, k=7, and n=89 are herein employed. In the first place, the original signal S10 is input in the format of a0(1), a0(2), ..., a0(n-k) (step 901). Most significant m bits are selected from the input signal, and inserted into the data format of $$V(1), V(2), \ldots, V(m) \ (n-k) \geqq m$$

(step 902). Then, V(1), V(2), ..., V(m) yielded in step 902 are used to calculate $V(x) \cdot x^k / G_{crc}(x) = Q(x) + B(x)/G_{crc}(x)$ for evaluation of the remainder polynomial $B(x)$. It is herein assumed that $G_{crc}(X)$ is a generating polynomial, and $Q(x)$ is a division polynomial, and that the following equations $$V(x)=V(1).X^{11}+V(2).X^{10}+\ldots+V(12).x^0$$

$$G_{crc}(X)=X^7+X^5+X^4+X^2+X+1$$

$$B(x)=V(m+1).x^6+V(m+2).x^5+\ldots+V(m+k)-x^0$$

are used in the case where those equations are desirous to be fit to the standard specification of IS54 of US.TIA (step 903).

Coefficients of $B(x)$ so obtained $$V(m+1), V(m+2), \ldots, V(m+k)$$

are inserted into $$a0(n-k), a0(n-k-1), \ldots, a0(n) \text{ (step } \mathbf{904}\text{).}$$

A result S27 of evaluation of the error detecting code is output in a format $$a0(1), a0(2), \ldots, a0(n-k), \ldots, a0(n) \text{ (step } \mathbf{905}\text{).}$$

The error correcting/encoding part 11 executes the processing described in the first embodiment of the bit error counter device of the present invention, receives the result 27 of evaluation of the error detecting code and outputs the transmitting signal S11.

Successively, there will be described the receiver apparatus 20.

The format on the operation of the error correcting/decoding part 21 is yielded by eliminating step 316 to 318 in the flowchart in FIG. 3c in the first embodiment of the bit error counter device according to the present invention, and eliminating steps 319 and 320, and the steps 2 and 3 in the flowchart in FIG. 3a. The operation is identical to that illustrated in the flowchart of the first embodiment of the bit error counter device of the present invention.

There will be described the error detecting part 28.

Figure 10:
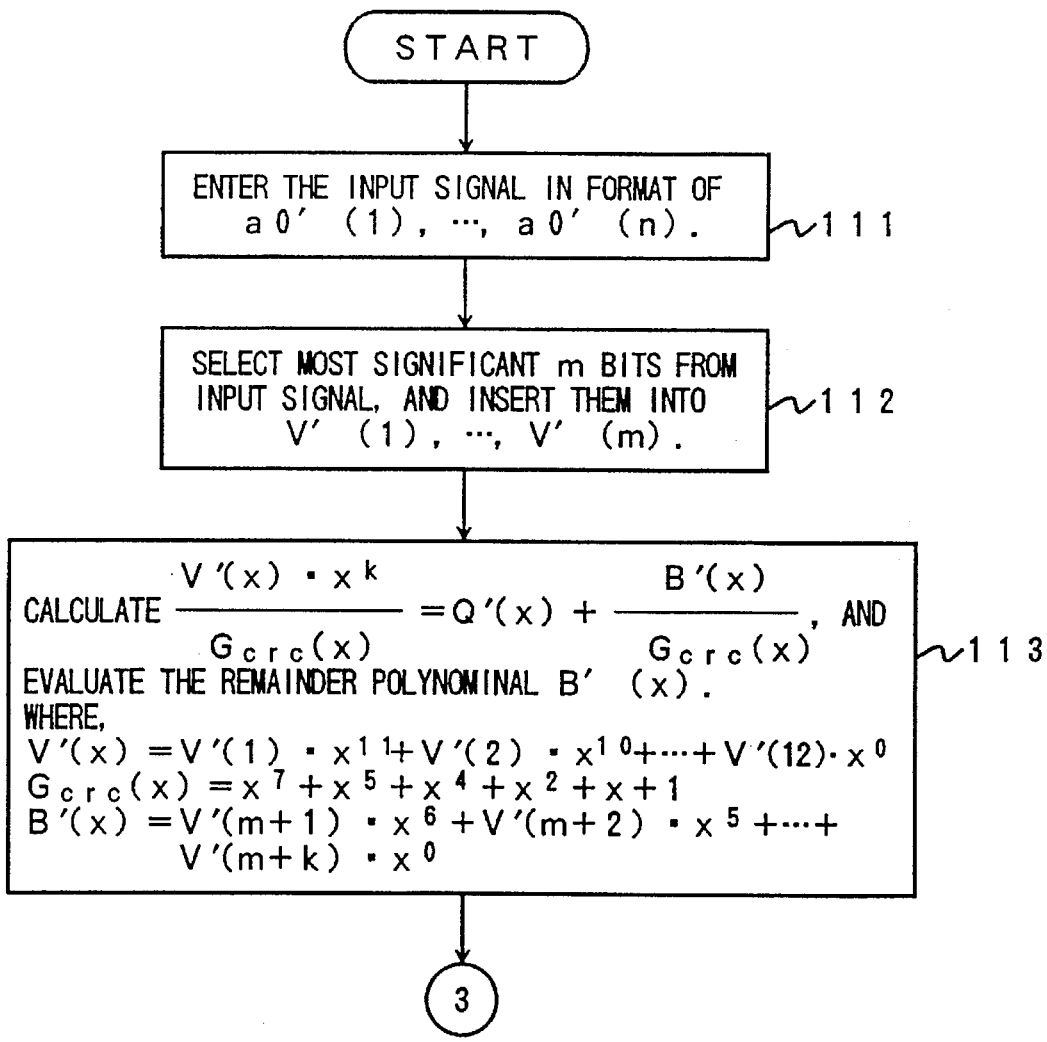
FIG. 10 is a flowchart illustrating the operation of an error detecting part.
Figure 11:
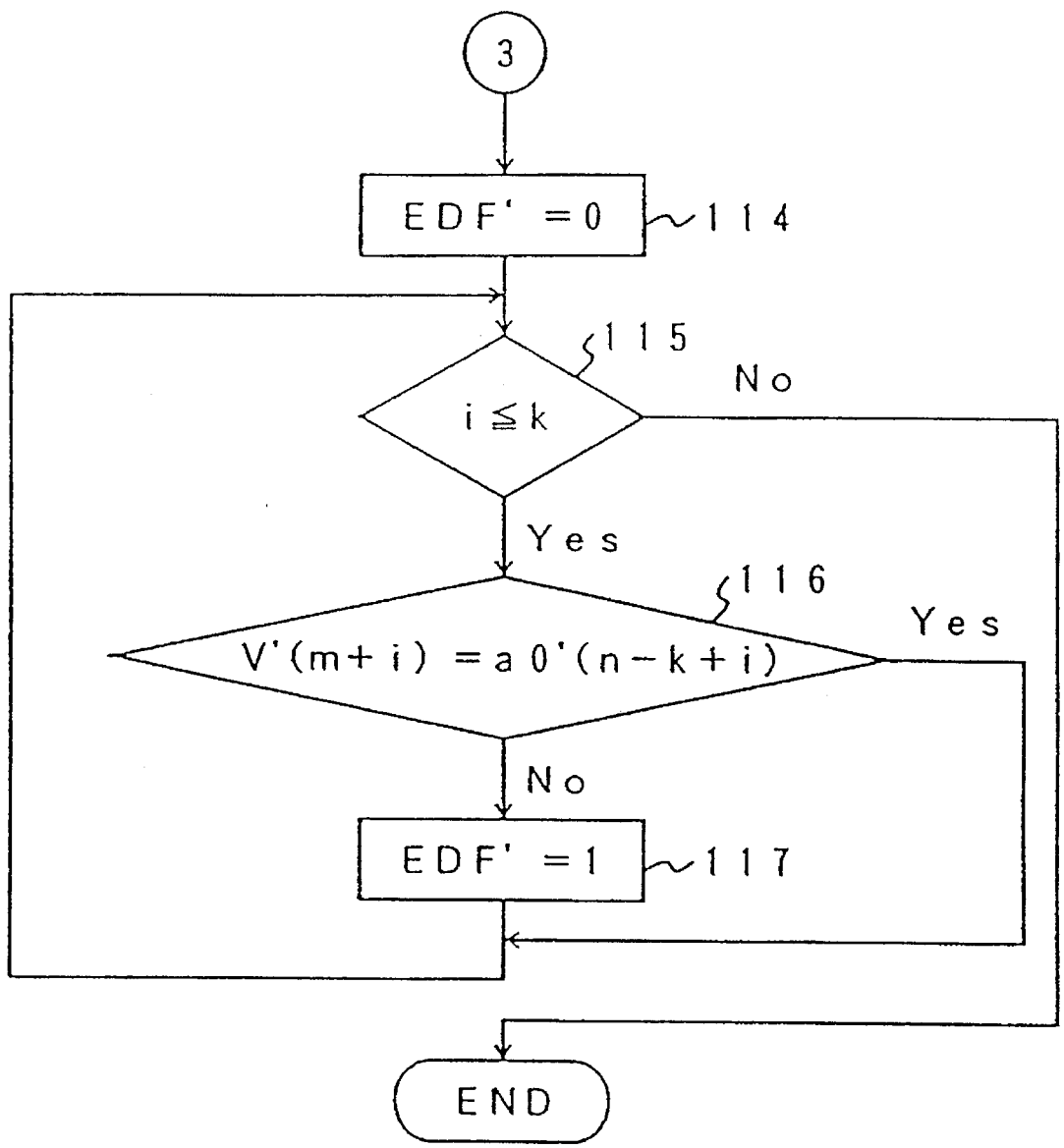
FIG. 11 is a flowchart further illustrating the operation of the error detector part.

The error detecting part 28 of the receiver apparatus 20 comprises a bit selector part for selecting the most significant m bits from the input signal, which part is analogous to the error detection code evaluating part 27, and encoder part for calculating an equation $$V'(x) \cdot x^k / G_{crc}(x) = Q'(x) + B'(X)/G_{crc}(X),$$

and evaluates a remainder $B'(x)$, which part is analogous to the error detection code evaluating part 27, and an error detecting signal generator part for comparing coefficients of calculated $B'(x)$ and part of the input signal with each other and generating an error detecting signal EDF. In succession, there will be described the exemplarily operation of the error detecting part 28 with reference to the flowcharts of FIGS. 10 and 11.

It is assumed that the input signal has a format given below $$a0'(1), a0'(2), \ldots, a0'(n-k), \ldots, a0'(n),$$

and further EDF'=1 or EDF'=0 is given. A processing method is identical to that in the error detection code evaluating part 27, i.e., in which method the decoded signal S29 is inputted in the format of $a0'(1), \ldots, a0'(n)$ (step 111), the most significant m bits are selected from the input signal and are inserted into $V'(1), \ldots, V'(m)$ (step 112), and the remainder polynomial $B'(x)$ is evaluated (step 113). More specifically, 0 is first inserted into EDF'(step 114), and if $i \leq k$ holds, then steps 116 and 117 are repeated (step 115). If $i \leq k$ is judged to hold in step 115, then an equation $$V'(m+i)=a0'(n-k+i)$$

is judged (step 116) with respect to the coefficients of the remainder polynomial $B'(x)$ yielded in step 113

$$V'(m+1), \ldots, V'(m+k)$$

and $$a0'(n-k+1), \ldots, a0'(n)$$

of the input decoded signal S29, and if there is existent any error, then the error detecting signal EDF'=1 is set (step 117). Without any error, the processing returns to step 115, and the identical processing is repeated. The initial value of i is 1 and is incremented by +1 each time the processing of step 115 is executed. If no error is detected after a number of processings of step 115 have been completed, then the decoded signal S28a and the error detecting signal S28b are outputted in the following format:

$$a0'(1), \ldots, a0'(n) \text{ and EDF'=0,;}$$

while if any error is detected, then the same signals are outputted in the following format;

$$a0'(1), \ldots, a0'(n) \text{ and EDF'=1.}$$

The switching part 23, re-encoding part 24, delay part 26, and comparator part 25 employ identical processing methods to those used in the first embodiment, respectively.

In what follows, there will be described a first embodiment of a signal identifier device according to the present invention.

Figure 12:
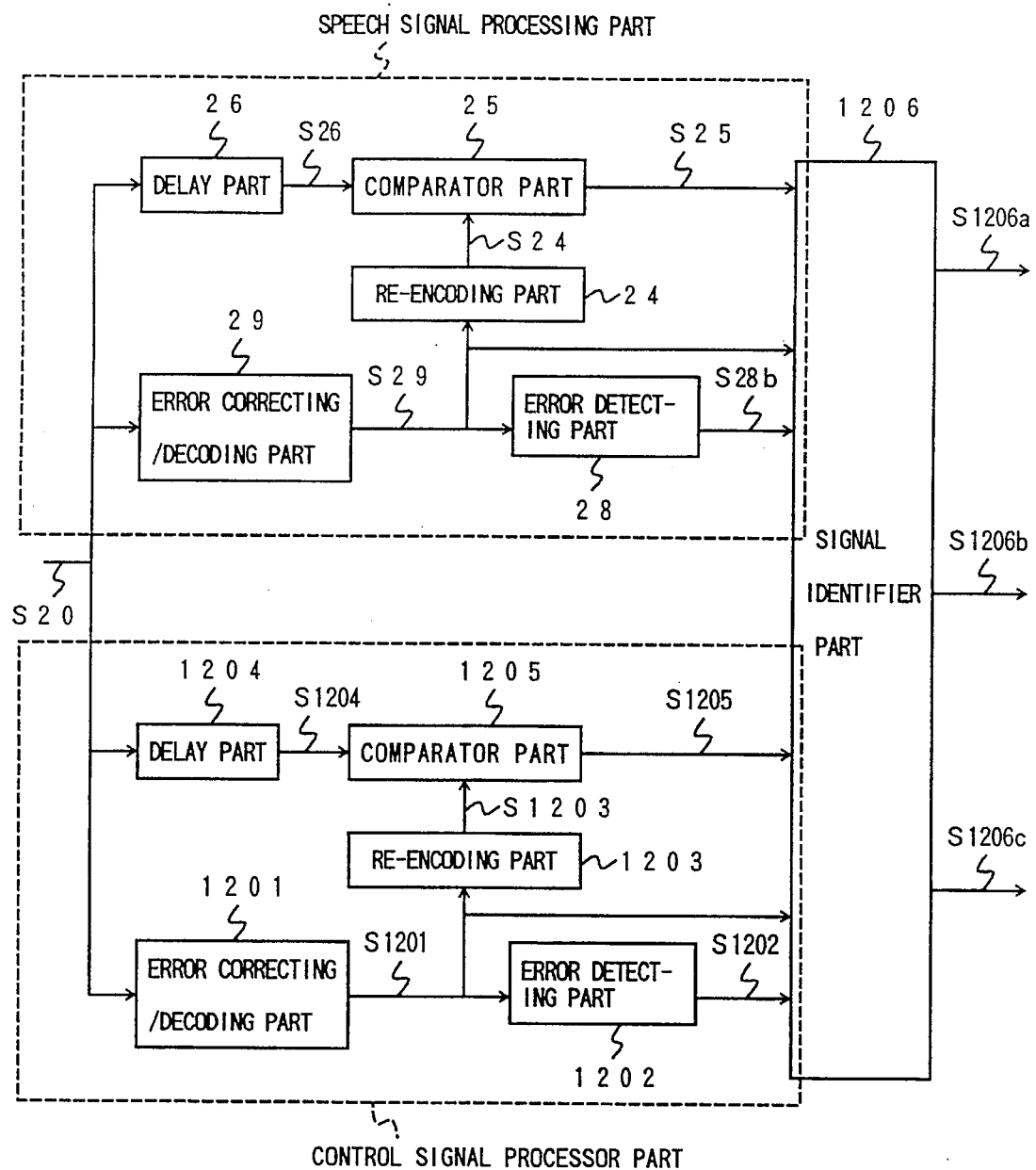
FIG. 12 is a block diagram illustrating the function of a first embodiment of a signal identifier device.

Referring to FIG. 12, there is schematically illustrated in the form of a block diagram a signal identifier device of the first embodiment of the present invention. The signal identifier device is set to be provided in a receiver apparatus of transmitter/receiver equipment for use in digital communication, the receiver apparatus being interconnected with a transmitter apparatus of the transmitter/receiver equipment through wire or radio means.

In the following, only the reception side will be described without any mention to the transmission side.

The receiver apparatus is divided into a speech signal processor part, a control signal processor part, and a signal identifier part as processing blocks.

The speech signal processor part comprises:

an error correcting/decoding part 29 for receiving a reception signal S20 and outputting a decoded signal S29;

an error detecting part 28 for receiving the decoded signal S29 and outputting an error detecting signal S28b;

a re-encoding part 24 for receiving the decoded signal S29 and outputting a re-encoding signal S24;

a delay part 26 for receiving the reception signal S20, delaying the reception signal S20 by the time during which the reception signal S20 is received by the error correcting/ decoding part 29 is processed by the error detecting part 28 and the re-encoding part 24, and outputting a delayed reception signal S26; and a comparator part 25 for receiving the delayed reception signal S26 and the re-encoded signal S24 and outputting the number of errors S25, the control error correcting/decoding part 1201 for receiving the reception signal S20 and outputting a decoded signal S1201;

an error detecting part 1202 for receiving the decoded signal S1201 and outputting an error detecting signal S1202;

a re-encoding part 1203 for receiving the decoded signal S1201 and outputting a re-encoded signal S1203;

a delay part 1204 for receiving the reception signal S20, and delaying the reception signal S20 by the time during which the reception signal S20, received by the error correcting/decoding part 1201, is processed by the error detector part 1202, and the re-encoding part 1203 and outputting a delayed reception signal S1204, and a comparator part 1205 for receiving the delayed reception signal S1204 and the re-encoded signal S1203 and outputting the number of errors S1205.

The signal identifier part comprises:

means for inputting the error detecting signal S28b, the decoded signal S29, and the number of errors S25 from the speech signal processor part and further inputting the error detecting signal S1202, the decoded signal S1201, and the number of errors S1205 from the control signal processor part;

means for judging whether the reception signal S20 is a speech signal or a control signal; and means for outputting an identification signal, a decoded signal, and the number of errors.

Successively, there will be described the exemplarily detailed construction or operation of the respective devices.

In the first place, there will be described the speech signal processor part.

An error correcting/decoding part 29, an error detecting part 28, a re-encoding part 24, a comparator part 25, and a delay part 26 in the speech signal processor part are constructed and operated in the same manner as in the second embodiment of the bit error counter device.

Successively, there will be described the control signal processor part.

An error correcting/decoding part 1201 in the control signal processor part is operated substantially in the same manner as in the flowcharts each illustrated in FIGS. 3a, 3b, 3c, 3d, 3e, and 3f described in the first embodiment of the bit error counter device of the present invention. The following description is only for operations different from those illustrated in the just-mentioned flowcharts. A format of an input signal is assumed to be a1'(i), a2'(i), a3'(i), a4'(i), with $1 \leq i \leq n$, n=65, and n1=restriction length. First in step 301, there are inserted 1 into i, 2 into t, 0 into S2 (im) within the range of $0 \leq im \leq 2^{n1}-1$, 0 into j, and im into PM(im) with the range of $0 \leq im \leq 2^{n1}-1$. Further, in step 302, a1'(i), a2'(i), a3'(i), and a4'(i) are input, and in step 305 (illustrated in FIG. 3b), the following equations are calculated.

$x = a1'(i) \oplus b1(m,k0) + a2'(i) \oplus b2(m,k0)$ $+ a3'(i) \oplus b3(m,k0) + a4'(i) \oplus b4(m,k0)$ $y = a1'(i) \oplus b1(m,k1) + a2'(i) \oplus b2(m,k1)$ $+ a3'(i) \oplus b3(m,k1) + a4'(i) \oplus b4(m,k1)$ Operations other than those described above are identical to that illustrated in the flowchart of FIG. 3b.

Figure 15:
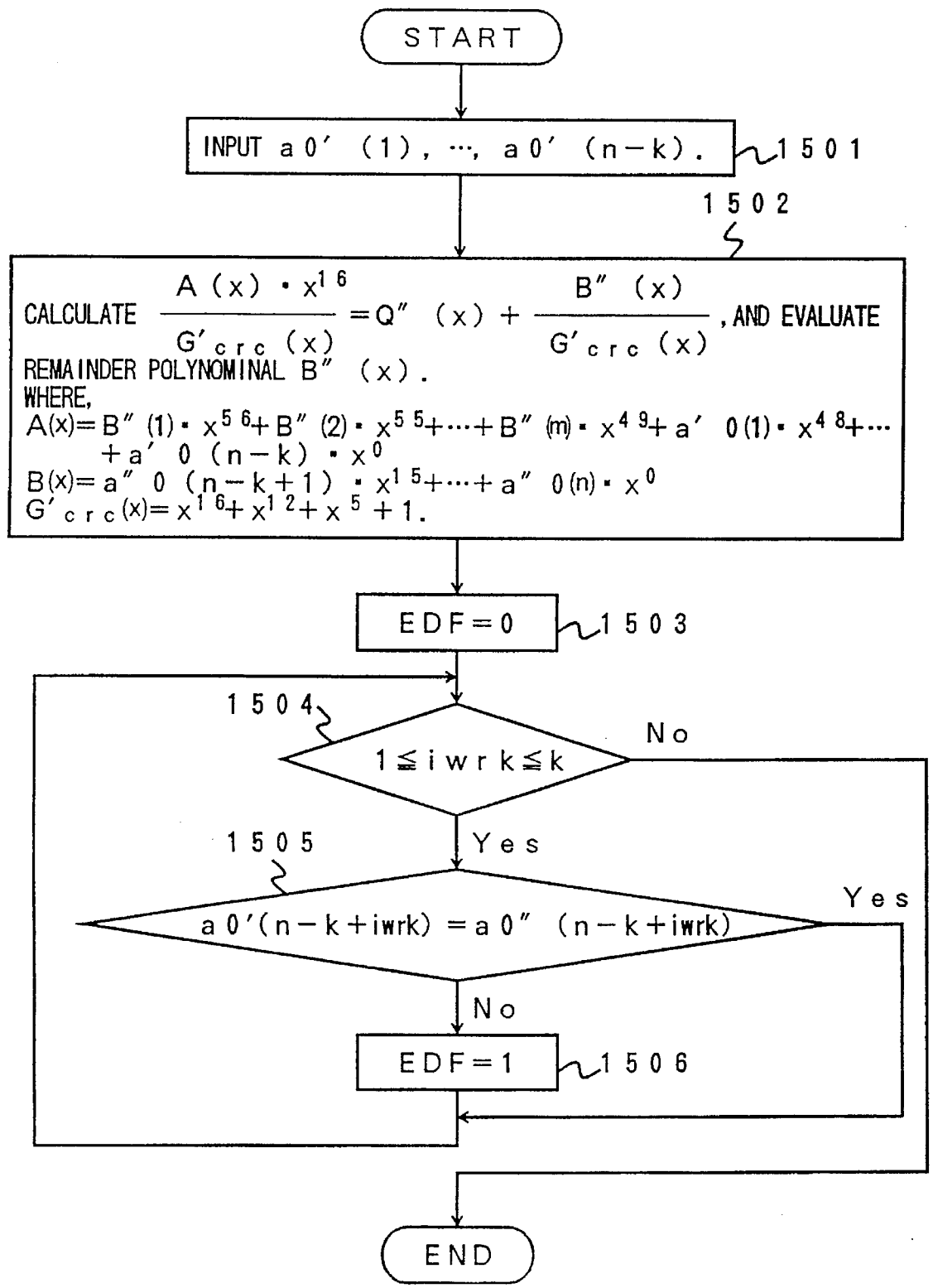
FIG. 15 is a flowchart illustrating the operation of an error detecting part for control signals.

The error detector part 1202 comprises a data input part for inputting data, an encoding part for evaluating an equation $$A(x) \cdot x^{16}/G_{crc}'(x) = Q''(x) + B''(x)/G_{crc}'(x),$$

and further evaluating a remainder polynomial B"(x), and an error detecting signal generator part for comparing the coefficients of the evaluated B"(x) and part of the input signal, and generating an error detecting signal EDF. Successively, there will be described the exemplarily operation of the error detector part 1202 with reference to the flowchart of FIG. 15.

Figure 13:
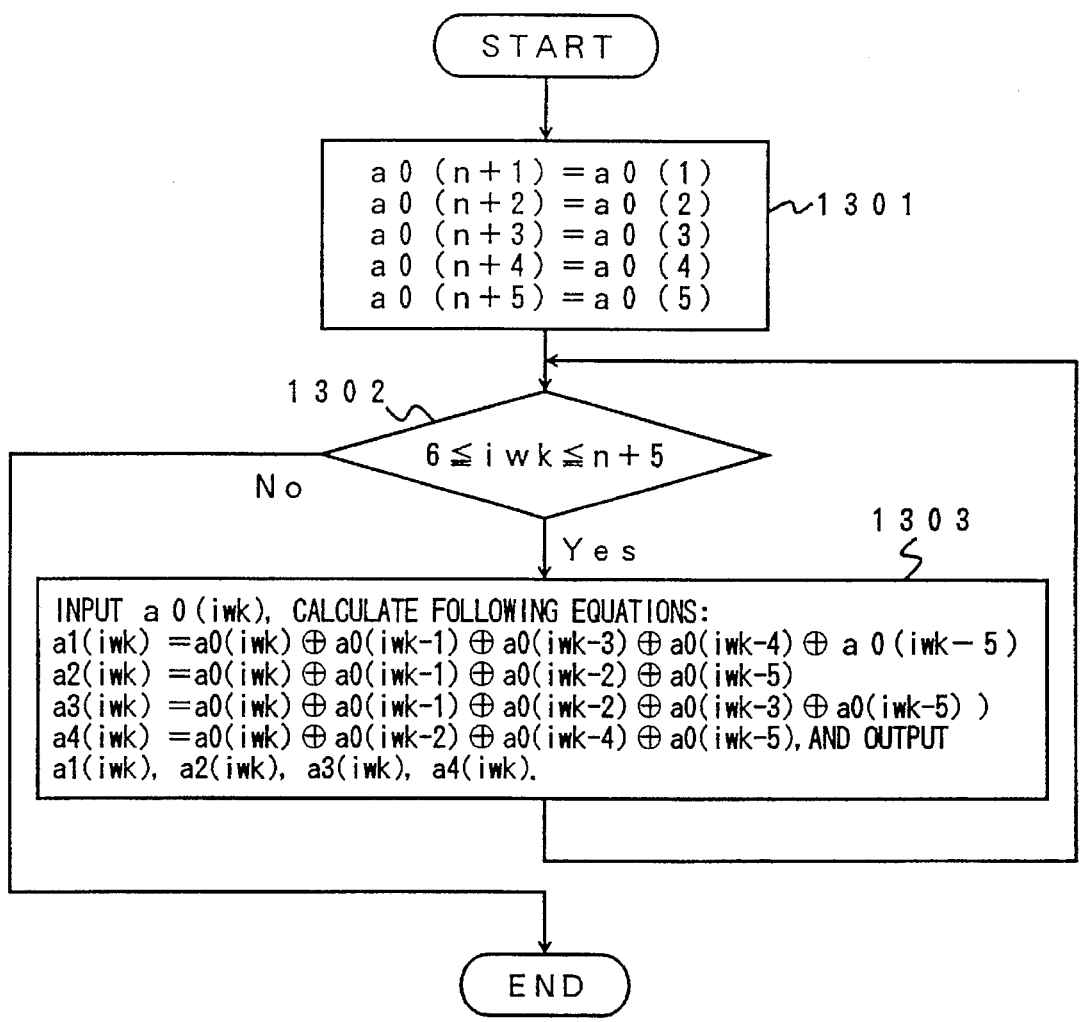
FIG. 13 Is a flowchart illustrating the operation of a encoder part for control signals.

It is herein assumed that the format of the input signal is a0'(1), ... , a0'(n-k), ... , a0'(n), and the format of the output signal is a0'(1), ... , a0'(n-k), ... , a0'(n), and further EDF=1 or EDF=0. In procedure 1501, a0'(1), ... , a0'(n-k) are input, and in step 1502, an equation $$A(x) \cdot x^{16}/G_{crc}'(x) = Q''(x) + B''(x)/G_{crc}'(x)$$

is calculated. The generating polynomial $G_{crc}'(x)$ is assumed to take the form of $X^{16}+X^{12}+X^5+1$. Then, 0 is inserted into the error detecting signal EDF (step 1503), and a0'(n-k+iw+rk)=a0"(n-k+iwrk) is judged (step 1505) within the range of $1 \leq iwrk \leq k$ (step 1503). a0" (n-k+1), ..., a0"(n) are coefficients of the remainder polynomial B"(x). If a0'(n-k+iwrk)≠a0"(n-k+iwrk) is judged to hold, then 1 is inserted into the error detecting signal EDF (step 1506) and the processing advances to step 1504, while if a0'(n-k+iwrk)=a0"(n-k+iwrk) is judged, then the processing advances directly to step 1504. Further, if iwrk>k is judged in step 1504, then the processing is completed. The re-encoding part 1203 is means for re-encoding a control signal (FACCH signal for example), and comprises an initializing part for initializing a calculation region for convolution-encoding of the input decoded part for convolution-encoding the input decoded signal S1201 and outputting the re-encoded signal S1203. Successively, there will be described the exemplarily operation of the re-encoding part 1203 with reference to the flowchart of FIG. 13.

The data format of the input signal is herein assumed to be a0'(1), a0'(2), ... , a0'(n), and the data format of the output signal is assumed to be a1"(1), a2"(1), a3"(1), a4"(1), ... , a1"(n), a2"(n), a3"(n), a4"(n).

In the first place, there is inserted a0(1) into a0(n+1), a0(2) into a0(n+2), a0(3) into a0(n+3), a0(4) into a0(n+4), and a0(5) into a0(n+5) (step 1301). Further, within the range of $6 \leq iwk \leq n+5$ (step 1302) step 1303 is repeated, and if $iwk>n+5$ is judged to hold in step 1302, then the processing is completed. In step 1303, a0(iwk) is input, and the following equations:

$$a1(iwk)=a0(iwk) \oplus a0(iwk-1) \oplus a0(iwk-3)$$
$$\oplus a0(iwk-4) \oplus a0(iwk-5)$$

$$a2(iwk)=a0(iwk) \oplus a0(iwk-1) \oplus a0(iwk-2)$$
$$\oplus a0(iwk-5)$$

$$a3(iwk)=a0(iwk) \oplus a0(iwk-1) \oplus a0(iwk-2)$$
$$\oplus a0(iwk-3) \beta a0(iwk-5)$$

$$a4(iwk)=a0(iwk) \beta a0(iwk-2) \beta a0(iwk-4)$$
$$\oplus a0(iwk-5)$$

are calculated and a1(iwk), a2(iwk), a3(iwk), and a4(iwk) are output. Thereafter, iwk is incremented by +1, and the processing advances to step 1302, where if $iwk>n+5$ is judged to hold, then the processing is completed.

The delay part 1204 and the comparator part 1205 are constructed identically to the delay part 26 and the comparator part 25 in the speech signal processor part, and hence are operated similarly thereto except for the fact that the data length of concern is different.

Successively, there will be described the signal identifier part 1206.

The signal processor part 1206 comprises a data input part for receiving error detecting signals, the number of errors, and decoded signals, each of which are output from both of the speech signal processor part and the control signal processor part, an input signal judging part for judging whether a reception signal is a speech signal or a control signal, and an output part for outputting an identification signal that indicates each of the judgment, a decoded signal, and the number of errors. There will now be described the operation of the signal identifier part 1206 with reference to the flowchart of FIG. 14.

First, there will be described two general processing steps in the signal identifier part 1206.

In the first processing, if the error detecting signal S28$b$ is judged to be correct, the number of errors S25 is judged to be larger than the set value 1, the error detecting signal S1202 is judged to be correct, the number of errors S1205 is judged to be larger than the set value 3, and the number of errors S25 is judged to be lager than the number of errors S1205, then there are outputted an FACCH signal as an identification signal S1206$a$, a decoded signal S1201 as a decoded signal S1206$b$, and the number of errors S1205 as the number of errors S1206$c$.

In the second processing, if the error detecting signals S28$b$ is judged to be false, and the number of errors S25 is judged to be smaller than the set value 2, then there are outputted a speech signal as the identification signal S1206$a$, a decoded signal S29 as the decoded signal S1206$b$, and the number of errors S25 as the number of errors S1206$c$.

Successively, there will be described in detailed the processing of the signal identifier part 1206. There are first input an error detecting signal S25, a decoded signal S29, and an error detecting signal S28$b$ each output from the speech signal processor part 1206, and an error detecting signal S1205, a decoded signal S1201, and an error detecting signal S1202 each output from the control signal processor part (step 1401). Then, the error detecting signal S28$b$ is judged to determine whether it is correct or not (step 1402), and if it is correct, then whether the number of errors S25>the set value 1 is judged to hold (step 1403). If this is judged to be correct, then the error detecting signal S1202 is judged (step 1404), and if it is judged to be correct, then the number of errors S1205>the set value 3 is judged to hold (step 1405), while if the number of errors S1205>the set value 3 is judged to hold, then the number of errors S25>the number of errors S1205 is judged to hold (step 1407), and if the number of errors S25>the number of errors S1205 is judged to hold, then there are assumed the identification signal S1206$a$ to be an FACCH signal, the decoded signal S1206$b$ to be a decoded signal S1201, and the number of errors S1206$c$ to be the number of errors S1205 (step 1408).

Further, if in step 1407 the number of errors S25$\leq$the number of errors S1205 is judged to hold, then there are assumed the identification signal S1206$a$ to be a speech signal, the decoded signal S1206$b$ to be a decoded signal S29, and the number of errors S1206$c$ to be the number of errors S25 (step 1410).

Further, if in step 1405 the number of errors S1205$\leq$the set value 3 is judged, then step 1407 is bypassed and step 1408 is executed.

Further, if in step 1404, the error detecting signal S1202 is judged to be false, then the number of errors S1205<the set value 4 is judged (step 1406), and if the number of errors S1205<the set value 4 is judged to hold, the step 1408 is executed while if the number of errors S1205$\leq$the set value 4 is judged, then step 1407 is executed.

Further, if in step 1403 the number of errors S25$\leq$the set value 1, then step 1410 is executed.

Further, if in step 1402 the error detecting signal S28$b$ is judged to be false, then the number of errors S25<the set value 2 is judged (step 1409), and if the number of errors S25<the set value 2 is judged to hold, then step 1410 is executed while if the number of errors S25$\geq$the set value 2 is judged to hold, then step 1404 is executed.

After the processing of step 1408 or 1410 is completed, there are output the identification signal S1206$a$, the decoded signal S1206$b$, and the number of errors S1206$c$ (step 1411), resulting in the completion of the processing. Each of the set values 1, 2, 3, and 4 is set with the aid of the maximum number of correctable errors as a reference in an error correcting code to be used. The set values 1 and 3 may be infinite, and the set values 2 and 4 may be 0.

In the following, there will be described a second embodiment of the signal identifier device of the present invention.

Figure 16:
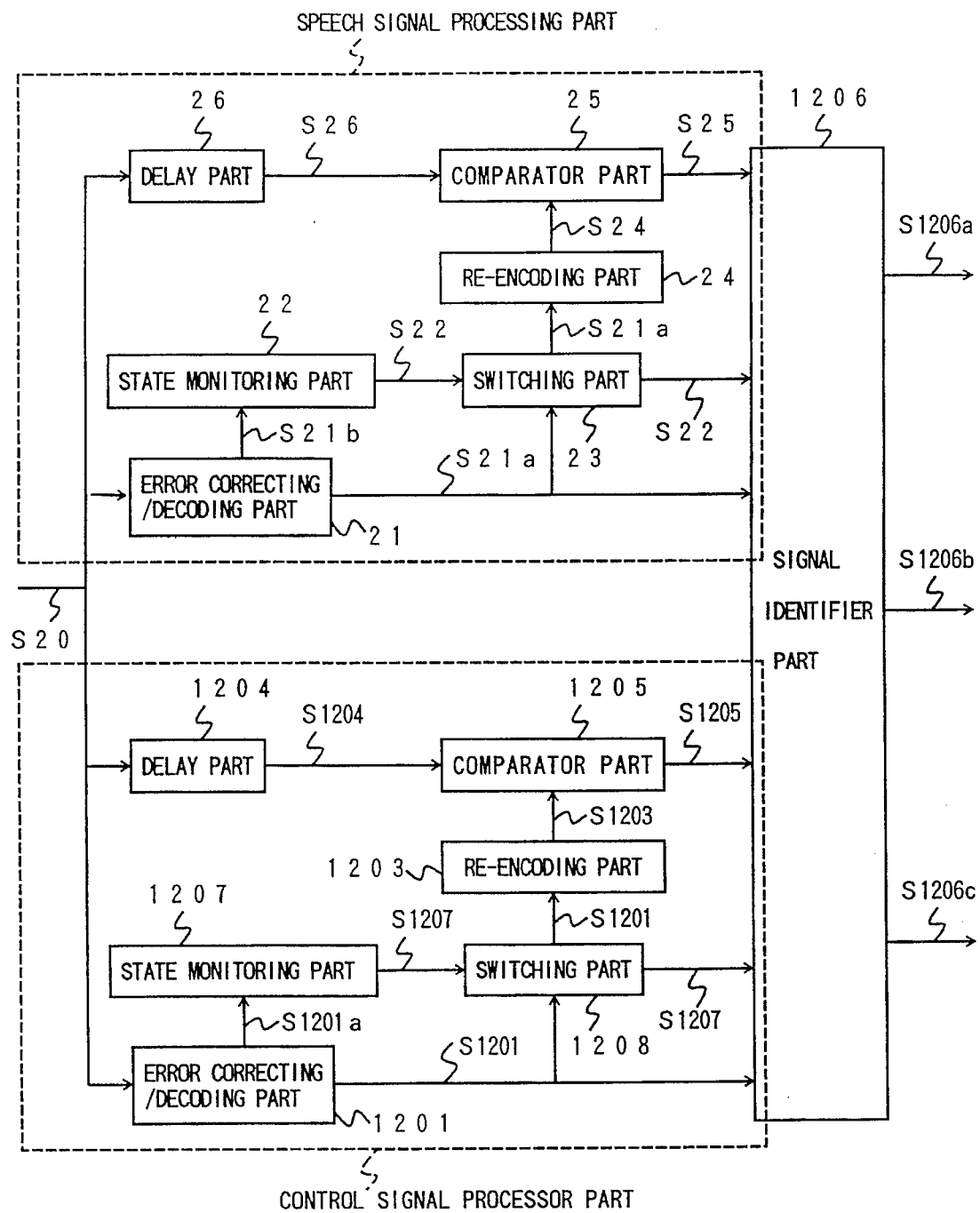
FIG. 16 is a block diagram illustrating the function of a second embodiment of the signal identifier device.

Referring to FIG. 16, there is illustrated in the form of a functional block diagram a second identifier device of the second embodiment of the signal identifier device of the present invention. The signal identifier device is to be provided in a receiver apparatus in transmitter/receiver equipment for use in digital communication, and is identical to the first embodiment of the signal identifier device of the present invention in that a transmitter apparatus and the receiver apparatus are interconnected with each other through wire or radio means.

In the following, only a reception side will be described without any mention of the transmission side.

The receiver apparatus is divided into a speech signal processing part, a control signal processing part, and a signal identifier part.

The speech signal processing part comprises:

an error correcting/decoding part 21 for receiving a reception signal S20 and outputting a decoded signal S21$a$ and an overflow signal S21$b$, a state monitoring part 22 for receiving the overflow signal S21$b$ and outputting a switching instruction signal S22, a switching part 23 for receiving the switching instruction signal S22 and the decoded signal S21a, and outputting the switching instruction signal S22 and the decoded signal S21a, a re-encoding part 24 for receiving the decoded signal S21a outputted from the switching part 23, and outputting a re-encoding signal S24, a delay part 26 for receiving the reception signal S20, and delaying the reception signal S20 by the time during which the reception signal S20 input into the error correcting/decoding part 21 is processed by the state monitoring part 22, the s switching part 23, and the re-encoding part 24 and outputting a delayed reception signal S26, and a comparator part 25 for receiving the delayed reception signal S26 and the re-encoding signal S24, and outputting the number of errors S25, the control signal processor part comprises:

an error correcting/decoding part 1201 for receiving a reception signal S20, and outputting a decoded signal S1201 and an overflow signal S1201a, a state monitoring part 1207 for receiving the overflow signal S1201a, and outputting a switching instruction signal S1207, a switching part 1208 for receiving the switching instruction signal S1207 and the decoded signal S1201, and outputting the switching instruction signal S1207 and the decoded signal S1201.

a re-encoding part 1203 for receiving the decoded signal S1201 output from the switching part 1208, and outputting a re-encoding signal S1203, a delay part 1204 for receiving the reception signal S20, and delaying the reception signal S20 by the time during which the reception signal input into the error correcting/decoding part 1201 is processed by the state monitoring part 1207, the switching part 1208, and the re-encoding part 1203, and outputting a delayed reception signal S1204, and a comparator part 1205 for receiving the delayed reception signal S1204 and the re-encoding signal S1203, and outputting the number of errors S1205, the signal identifier part comprises:

means for inputting the switching instruction signal S22, the decoded signal S21a, and the number of errors S25 from the speech signal processor part and further inputting the switching instruction signal S1207, the decoded signal S1201, and the number of errors S1205 from the control signal processor part, means for judging whether the reception signal S20 is a speech signal or a control signal, and means for outputting an identification signal, a decoded signal, and the number of errors as a result of the judgment.

Successively, there will be described the exemplarily construction or operation of each detailed device portion.

First, there will be described the speech signal processor part.

The error correcting/decoding part 21, state monitoring part 22, re-encoding part 24, comparator part 25, and delay part 26 in the speech signal processor part are constructed identically to those disclosed in the second embodiment of the bit error counter device, and hence identical operations are assumed. There will be described the exemplarily operation of the switching part 23 with reference to the flowchart of FIG. 17. The switching part 23 executes steps 501 and 503 (illustrated in FIG. 5), and judges whether or not EDF=1 holds in step 502 (illustrated in FIG. 5). If EDF=0 is judged to hold, then it outputs EDF=0 (step 1701), while if EDF=1 is judged to hold, then it outputs EDF=1 (step 1702), and the processing is completed.

Successively, there will be described the control signal processor part.

An error correcting/decoding part 1201, a delay part 1204, a comparator part 1205, a re-encoding part 1203, and a state monitoring part 1207 in the control signal processor part are constructed identically to those described in the first embodiment of the signal identifier device of the present invention, and hence are operated similarly to the latter except that a data length of concern is different from the latter.

Figure 17:
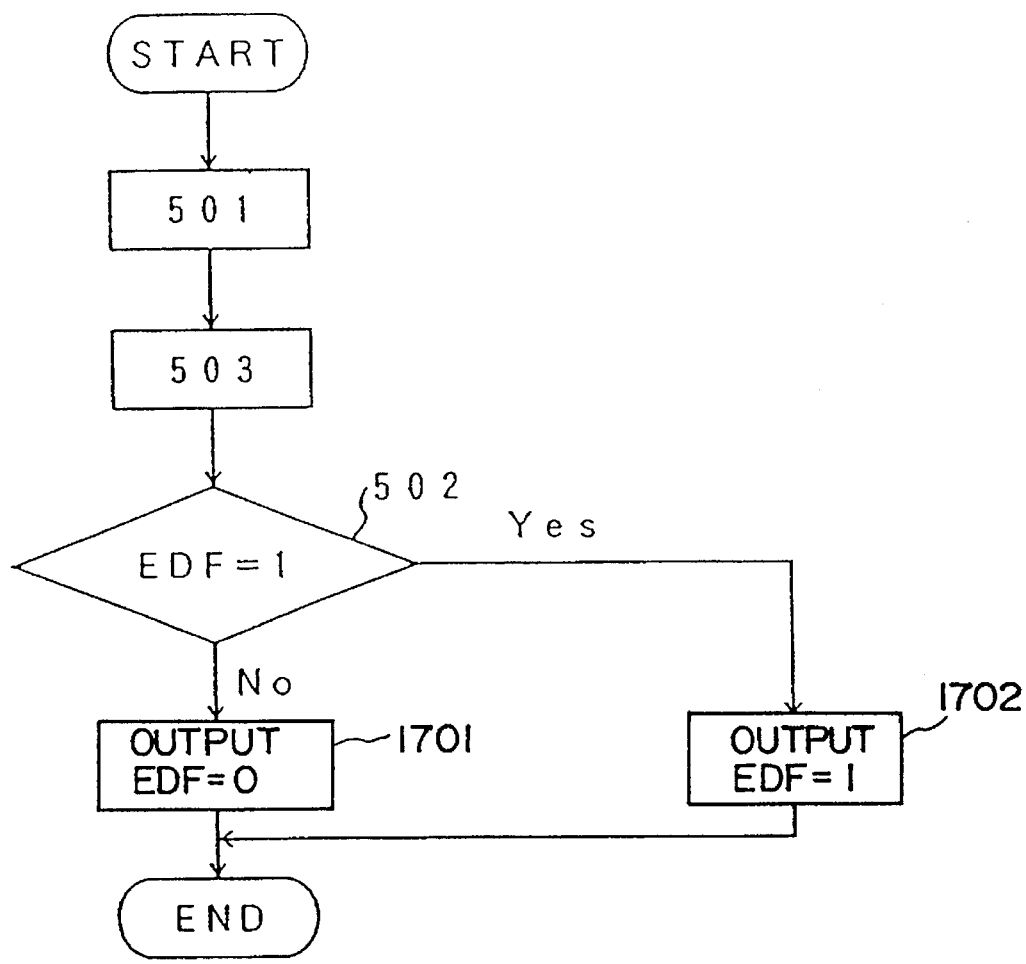
FIG. 17 is a flowchart illustrating the operation of a switching part of the signal identifier device.

There will be described the exemplarily operation of the switching part 1208 with reference to the flowchart of FIG. 17. The switching part 1208 executes steps 501 and 503 (illustrated in FIG. 5), and it judges in step 502 EDF=1 or not (illustrated in FIG. 5). If EDF=0 is judged to hold, then EDF=0 is outputted (step 1701), while EDF=1 is judged to hold, then EDF=1 is outputted (step 1702), and the processing is completed.

The signal identifier part 1206 is constructed identically to the signal identifier part disclosed in the first embodiment of the signal identifier device of the present invention, and each switching instruction signal is input instead of each error detecting signal followed by the identical operation to the latter.

The bit error identifying method and device according to the present invention is suitable as disclosed above for use in land mobile communication such as cordless telephones, mobile telephones, portable telephones, pocket bells, simple land radio telephones, and teleterminal system, maritime mobile communication such as ship telephones and maritime satellite communication, or aircraft mobile communication such as aircraft public stations.

Additionally, the method and device are suitable for use in radio mobile communication used in varieties of public organizations, MCA land mobile radio communication systems, service self-management communication such as taxi radio, and particular small power radio stations.

What is claimed is:

1. A bit error counter device for use in a digital communication system having transmitter and receiver equipment for digital communication between a transmission side and a reception side, the device comprising in the transmitter equipment;

initialization means for initializing convolution-encoding of an input original signal; and convolution-encoding means for receiving the original signal and outputting a transmission signal by convolution-encoding the original signal, and the device comprising in the receiver equipment;

error correcting/decoding means for inputting a reception signal corresponding to the transmission signal and outputting a decoded signal, and when an overflow occurs, for outputting an overflow signal indicating an overflow condition;

state monitoring means for receiving the overflow signal and issuing a switching instruction signal only when the overflow signal is received indicating an overflow condition;

switching means for receiving the switching instruction signal and the decoded signal, wherein the switching means outputs at least one of a bit error rate or a number of errors when the switching instruction signal is received, and the switching means outputs the decoded signal when the switching instruction signal is not received;

re-encoding means for receiving the decoded signal output from the switching means and for outputting a re-encoded signal by subjecting the decoded signal to the same encoding as that of the reception signal; and comparator means for receiving the re-encoded signal and a delayed reception signal, and outputting the bit error rate and the number of errors.

2. A bit error counter device according to claim 1, wherein the state monitoring means comprises:

overflow signal identifier means for judging whether or not the overflow signal is input; and switching instruction signal output means for starting a count when the overflow signal is judged to be input and outputting the switching instruction signal when the count exceeds a predetermined value.

3. A bit error counter device according to claim 1, wherein the re-encoding means comprises:

initializing means for initializing convolution encoding of the decoded signal; and convolution-encoding means for receiving the decoded signal and outputting the re-encoded signal by convolution-encoding the decoded signal.

4. A bit error counter device according to claim 1, wherein the switching means comprises:

data input means for inputting the decoded signal and the switching instruction signal;

input signal judgment means for judging whether or not the switching instruction signal is input;

decoded signal output means for outputting the decoded signal when the switching instruction signal is judged not to be input; and set value output means for outputting a preset bit error rate and a preset number of errors when the switching instruction signal is input.

5. A bit error counter device according to claim 4, wherein the state monitoring means includes:

overflow signal judging means for judging whether or not the overflow signal is input; and switching instruction signal output means for starting a count when the overflow signal is judged to be input and issuing the switching instruction signal when the count exceeds a predetermined value.

6. A bit error counter device according to claim 1, wherein the comparator means comprises:

bit comparator means for comparing the delayed reception signal and the re-encoded signal for each bit thereof; and bit error rate evaluation means for evaluating the bit error rate.

7. A bit error counter device according to claim 6, wherein the re-encoding means comprises:

initializing means for initializing convolution-encoding of the decoded signal; and convolution-encoding means for receiving the decoded signal and outputting the re-encoded signal by convolution-encoding the decoded signal.

8. A bit error counter device according to claim 1, wherein the device includes path memory, and wherein the error correcting/decoding means comprises:

branch metric operation means for evaluating a branch metric;

ACS operating means for evaluating a minimum or a maximum branch metric value of the evaluated branch metric;

write means for writing path information of the minimum or maximum branch metric value of the ACS operating means; and means for detecting an overflow of the path memory, and, if an overflow of the path memory is detected: for outputting an overflow signal, for evaluating a maximum likelihood metric, for determining a decoded value, and for shifting the path memory, and if an overflow of the path memory is not detected: for executing path convergence, for determining a decoded value, and for shifting the path memory, and for evaluating the maximum likelihood metric and determining a decoded value.

9. A bit error counter device according to claim 8, wherein the re-encoding means comprises:

initializing means for initializing convolution-encoding of the decoded signal; and convolution encoding means for receiving the decoded signal and outputting the re-encoded signal by convolution-encoding the decoded signal.

10. A bit error counter device according to claim 9, wherein the comparator means comprises:

bit comparator means for comparing the delayed reception signal and the re-encoded signal for each bit thereof; and bit error rate evaluating means for evaluating the bit error rate.

11. A bit error counter device according to claim 1, further comprising delay means for inputting the reception signal and providing the delayed reception signal to the comparator means, the delay means delaying the reception signal by a time during which the reception signal is processed through the error correcting/decoding means, the state monitoring means, the switching means, and the re-encoding means.

12. A bit error counter device according to claim 11, wherein the state monitoring means comprises:

overflow signal identifier means for judging whether or not the overflow signal is input; and switching instruction signal output means for starting a count when the overflow signal is judged to be input, and outputting the switching instruction signal when the count exceeds a predetermined value.

13. A bit error counter device according to claim 11, wherein the re-encoding means comprises;

initializing means for initializing convolution-encoding of the decoded signal; and convolution-encoding means for receiving the decoded signal and outputting the re-encoded signal by convolution-encoding the decoded signal.

14. A bit error counter device according to claim 11, wherein the switching means comprises:

data input means for inputting the decoded signal and the switching instruction signal;

input signal judging means for judging whether or not the switching instruction signal is input;

decoded signal output means for outputting the decoded signal when the switching instruction signal is judged not to be input; and preset value output means for outputting a preset bit error rate and a preset number of errors when the switching instruction signal is judged to be input.

15. A bit error counter device according to claim 14, wherein the state monitoring means comprises:

overflow signal identifier means for judging whether or not the overflow signal is input; and switching instruction signal output means for starting a count when the overflow signal is judged to be input, and outputting the switching instruction signal when the count exceeds a predetermined value.

16. A bit error counter device according to claim 11, wherein the comparator means comprises:

bit comparator means for comparing the delayed reception signal and the re-encoded signal with each other for each bit thereof; and bit error rate evaluating means for evaluating the bit error rate.

17. A bit error counter device according to claim 16, wherein the re-encoding means comprises:

initializing means for initializing convolution-encoding of the decoded signal; and convolution-encoding means for receiving the decoded signal and outputting the re-encoded signal by convolution-encoding the decoded signal.

18. A bit error counter device according to claim 11, wherein the device includes path memory, and wherein the error correcting/decoding means comprises:

branch metric evaluating means for evaluating a branch metric;

ACS evaluating means for evaluating a minimum or a maximum branch metric value of the evaluated branch metric;

path information writing means for writing the minimum or maximum branch metric value of the ACS evaluating means; and means for detecting an overflow of the path memory, and, when an overflow of the path memory is detected:

for outputting an overflow signal, for evaluating a maximum likelihood metric value, for determining a decoded value, and for shifting the path memory; and, when an overflow of the path memory is not detected:

for executing path convergence, for determining a decoded value, and for shifting the path memory, and for evaluating the maximum likelihood metric value and determining the decoded value.

19. A bit error counter device according to claim 18, wherein the re-encoding means comprises:

initializing means for initializing convolution-encoding of the decoded signal; and convolution-encoding means for receiving the decoded signal and outputting the re-encoded signal by convolution-encoding the decoded signal.

20. A bit error counter device according to claim 19, wherein the comparator means comprises:

bit comparator means for comparing the delayed reception signal and the re-encoded signal for each bit thereof; and bit error rate evaluating means for evaluating the bit error rate.

21. A bit error counter device for use in transmitter and receiver equipment for digital communication between a transmission side and a reception side, the device comprising in the transmitter equipment:

error detecting code evaluating means for receiving an original signal, evaluating an error detecting code from the original signal, and outputting an evaluation result of the error detecting code;

error correcting/encoding means, including initializing means for initializing convolution-encoding of the input original signal, and convolution-encoding means for receiving the original signal and outputting a transmission signal by convolution-encoding the original signal, the device comprising in the receiver equipment:

error correcting/decoding means for receiving a reception signal corresponding to the transmission signal and outputting a decoded signal;

error detector means for receiving the decoded signal, decoding the error detecting code and outputting a decoded signal, and further outputting an error detecting signal when any error is detected;

switching means for receiving the decoded signal and the error detecting signal, and outputting at least one of a bit error rate or a number of errors when the error detecting signal is inputs and outputting the decoded signal when the error detecting signal is not input;

re-encoding means for receiving the decoded signal output from the switching means and outputting a re-encoded signal by subjecting the decoded signal to the same encoding as that of the reception signal; and comparator means for receiving the re-encoded signal and a delayed reception signal, and outputting at least one of the bit error rate or the number of errors.

22. A bit error counter device according to claim 21, wherein the error detecting code evaluating means comprises:

selector means for selecting a predetermined number of bits from the most significant bit of the original signal; and encoding means for evaluating a remainder polynomial.

23. A bit error counter device according to claim 22, wherein the error detector means comprises:

selector means for selecting a predetermined number of bits from the most significant bits of the decoded signal;

encoding means for evaluating a remainder polynomial; and error detecting signal generator means for comparing the remainder polynomial and part of the decoded signal and outputting the error detecting signal.

24. A bit error counter device according to claim 22, wherein the switching means comprises:

data input means for inputting the decoded signal and the error detecting signal;

input signal judging means for judging whether or not the error detecting signal is input;

decoded signal output means for outputting the decoded signal when the error detecting signal is judged not to be input; and set value output means for outputting a preset bit error rate and a preset number of errors when the error detecting signal is judged to be input.

25. A bit error counter device according to claim 22, wherein the comparator means comprises:

bit comparator means for comparing a delayed reception signal and the re-encoded signal for each bit thereof; and bit error rate evaluating means for evaluating the bit error rate.

26. A bit error counter device according to claim 22, further comprising delay means for delaying the reception signal by a time during which the reception signal is processed by the error correcting/decoding means, the error detector means, the switching means; and the re-encoding means.

27. A bit error counter device according to claim 26, wherein the error detector means comprises:

selector means for selecting a predetermined number of bits from the most significant bits of the decoded signal;

encoding means for evaluating a remainder polynomial; and error detecting signal generator means for comparing the remainder polynomial and part of the decoded signal with each other, and outputting the error detecting signal.

28. A bit error counter device according to claim 26, wherein the switching means comprises:

data input means for inputting the decoded signal and the error detecting signal;

input signal judging means for judging whether or not the error detecting signal is input;

decoded signal output means for outputting the decoded signal when the error detecting signal is judged not to be input; and set value output means for outputting a preset bit error rate and a preset number of errors when the error detecting signal is judged to be input.

29. A bit error counter device according to claim 26, wherein the comparator means comprises:

bit comparator means for comparing the delayed reception signal and the re-encoded signal for each bit thereof; and bit error rate evaluating means for evaluating the bit error rate.

30. A signal identifier device for use in a digital communication system having transmitter andreceiver apparatus, the device being provided in the receiver apparatus, the device comprising:

speech signal processor means;

control signal processor means; and signal identifier means; wherein the speech signal processor means includes:
  a first error correcting/decoding means for receiving a reception signal and outputting a decoded signal;
  a first error detector means for receiving the decoded signal and outputting an error detecting signal;
  a first re-encoding means for receiving the decoded signal, encoding the decoded signal with the same encoding used in the transmitter apparatus, and outputting a re-encoded signal; and
  a first comparator means for receiving a delayed reception signal and the re-encoded signal, and outputting a number of errors, wherein the control signal processor means includes:
  a second error correcting/decoding means for receiving a reception signal and outputting a decoded signal;
  a second error detector means for receiving the decoded signal from the second error correcting/decoding means and outputting a n error detecting signal;
  a second re-encoding means for receiving the decoded signal from the second error correcting/decoding means, encoding the decoded signal with the same encoding used in the transmitter apparatus, and outputting a re-encoded signal; and
  a second comparator means for receiving a delayed reception signal and the re-encoded signal from the second re-encoding means, and outputting a number of errors; and
wherein the signal identifier means includes:
  means for inputting the error detecting signal, the decoded signal, and the number of errors from the speech signal processor means;

means for judging whether the reception signal is a speech signal or a control signal; and means for outputting an identification signal, and a respective decoded signal and number of errors from at least one of the speech signal processor means or the control signal processor means.

31. A signal identifier device according to claim 30, further comprising delay means for delaying the reception signal and providing the delayed reception signal to the respective first and second comparator means, the delay means delaying the reception signal by a respective time during which the reception signal is processed by the respective error correcting/decoding means, the respective state monitoring means, the respective switching means, and the respective re-encoding means.

32. A signal identifier device for use in a digital communication system having transmitter andreceiver apparatus, the device being provided in the receiver apparatus, the device comprising:

speech signal processor means;

control signal processor means; and signal identifier means, wherein the speech signal processor means includes:
  first error correcting/decoding means for inputting a reception signal, and outputting a decoded signal, and further monitoring the process of decoding of the reception signal and outputting a n overflow signal when an overflow occurs during decoding;
  first state monitoring means for receiving the overflow signal and issuing a switching instruction signal only when the overflow signal is input;
  first switching means for receiving the switching instruction signal and the decoded signal, and outputting the switching instruction signal when the switching instruction signal is input or outputting the decoded signal when the switching instruction signal is not input;
  first re-encoding means for receiving the decoded signal output from the switching means and outputting a re-encoded signal for executing the same encoding as that of the reception signal to the decoded signal; and
  first comparator means for receiving the re-encoded signal and a delayed reception signal, and outputting at least one of a bit error rate or a number of bit errors,
wherein the control signal processor means includes:
  second error correcting/decoding means for receiving a reception signal and outputting a decoded signal, wherein the second error correcting/decoding means monitors decoding of the reception signal, and the second error correcting/decoding means outputs an overflow signal when an overflow occurs during the decoding;
  second state monitoring means for receiving the overflow signal from the second error correcting/decoding means and issuing a switching instruction signal only when the overflow signal is input;
  second switching means for receiving the switching instruction signal from the second state monitoring means and the decoded signal from the second error correcting/decoding means, and outputting the switching instruction signal when the switching instruction signal is input and outputting the decoded signal when the switching instruction signal is not input;
  second re-encoding means for receiving the decoded signal output from the second switching means, and outputting a re-encoded signal for executing the same encoding as that of the reception signal to the decoded signal; and second comparator means for receiving the re-encoded signal from the second re-encoding means and a delayed reception signal, and outputting at least one of a bit error rate or a number of errors, and wherein the signal identifier means includes:

means for inputting the error signal, the decoded signal, and the number of errors from the speech signal processor means;

means for judging whether the reception signal is a speech signal or a control signal; and means for outputting an identification signal, and a respective decoded signal and number of errors from at least one of the speech signal processor means or the control signal processor means.

33. A signal identifier device according to claim 32, wherein the signal identifier device further comprises delay means for delaying the reception signal in the speech signal processor means and the control signal processor means by a respective time period during which the reception signal is processed by the respective error correcting/decoding means, the respective state monitoring means, the respective switching means, and the respective re-encoding means.

34. A bit error counting method for use in transmitting/receiving an digital communication between a transmission side and a reception side, the method in the transmission side comprising:

an initializing step for initializing convolution-encoding of an input original signal; and an error correcting/encoding step including a convolution-encoding step for receiving the original signal and outputting the transmission signal by convolution-encoding the original signal;

the method in the reception side comprising:

an error correcting/decoding step for inputting a reception signal corresponding to the transmission signal and outputting a decoded signal, monitoring decoding of the reception signal and outputting an overflow signal when an overflow occurs during decoding;

a state monitoring step for receiving the overflow signal and issuing a switching instruction signal only when the overflow signal is input, a switching step for receiving the switching instruction signal and the decoded signal, and outputting at least one of a bit error rate or a number of errors when the switching instruction signal is input and outputting the decoded signal when the switching instruction signal is not input;

a re-encoding step for receiving the decoded signal output from the switching step and outputting a re-encoded signal for executing the same encoding as that of the reception signal to the decoded signal; and a comparing step for receiving the re-encoded signal and a delayed reception signal, and outputting at least one of the bit error rate or the number of errors.

35. A bit error counting method according to claim 34, wherein the state monitoring step includes:

an overflow signal identifying step for judging whether or not the overflow signal is input; and a switching instruction signal output step for starting a count when the overflow signal is judged to be input, and outputting the switching instruction signal when the count exceeds a predetermined value.

36. A bit error counting method according to claim 34, wherein the re-encoding step includes:

an initializing step for initializing convolution-encoding of the decoded signal; and a convolution-encoding step for receiving the decoded signal and outputting the re-encoded signal by convolution-encoding the decoded signal.

37. A bit error counting method according to claim 34, wherein the switching step includes:

a data input step for inputting the decoded signal and the switching instruction signal;

an input signal judging step for judging whether the switching instruction signal is input;

a decoded signal output step for outputting the decoded signal when the switching instruction signal is judged not to be input; and a set value output step for outputting a preset bit error rate and a preset number of errors when the switching instruction signal is judged to be input.

38. A bit error counting method according to claim 37, wherein the state monitoring step includes:

an overflow signal identifying step for judging whether or not the overflow signal is input, and a switching instruction signal output step for starting a count when the overflow signal is judged to be input and outputting the switching instruction signal when the count exceeds a predetermined value.

39. A bit error counting method according to claim 34, wherein the comparing step includes:

a bit comparing step for comparing a delayed reception signal and the re-encoded signal for each bit thereof; and a bit error rate evaluating step for evaluating the bit error rate.

40. A bit error counting method according to claim 39, wherein the re-encoding step includes:

an initializing step for initializing convolution-encoding of the decoded signal; and a convolution-encoding step for receiving the decoded signal and outputting the re-encoded signal by convolution-encoding the decoded signal.

41. A bit error counting method according to claim 34, wherein path memory is provided, and wherein the error correcting/decoding step includes:

a branch metric evaluating step for evaluating a branch metric;

an ACS evaluating step for evaluating a minimum or maximum branch metric value of the evaluated branch metric;

a writing step for writing path information of the minimum or maximum branch metric value yielded by the ACS evaluating step; and a step for indicating whether or not a path memory overflow has occurred, Comprising the steps of:

when the path memory overflows, outputting an overflow signal, evaluating a maximum likelihood metric, determining a decoded value, and shifting the path memory, when the path memory does not overflow, executing path convergence, determining a decoded value, and shifting the path memory, and evaluating a maximum likelihood metric and determining a decoded value.

42. A bit error counting method according to claim 41, wherein the encoding step includes:

an initializing step for initializing convolution-encoding of the decoded signal; and a convolution-encoding step for receiving the decoded signal and outputting the re-encoded signal by convolution-encoding the decoded signal.

43. A bit error counting method according to claim 42, wherein the comparing step includes:

a bit comparing step for comparing a delayed reception signal and the re-encoded signal for each bit thereof; and a bit error rate evaluating step for evaluating the bit error rate.

44. A bit error counting method according to claim 34, wherein a step for delaying the reception signal is provided for delaying the reception signal by a time during which the reception signal is processed by the error correcting/decoding step, the state monitoring step, the switching step, and the re-encoding step.

45. A bit error counting method according to claim 44, wherein the state monitoring step includes:

an overflow signal identifying step for judging whether or not the overflow signal is input; and a switching instruction signal outputting step for starting a count when the overflow signal is judged to be input and outputting the switching instruction signal when the count exceeds a predetermined value.

46. A bit error counting method according to claim 44, wherein the re-encoding step includes:

an initializing step for initializing convolution-encoding of the decoded signal; and a convolution-encoding step for receiving the decoded signal and outputting the re-encoded signal by convolution-encoding the decoded signal.

47. A bit error counting method according to claim 44, wherein the switching step includes:

a data input step for inputting the decoded signal and the switching instruction signal;

an input signal judging step for judging whether or not the switching instruction signal is input;

a decoded signal output step for outputting the decoded signal when the switching instruction signal is judged not to be input; and a set value output step for outputting a preset bit error rate and a preset number of errors when the switching instruction signal is judged to be input.

48. A bit error counting method according to claim 47, wherein the state monitoring step includes:

an overflow signal identifying step for judging whether or not the overflow signal is input; and a switching instruction signal output step for starting a count when the overflow signal is judged to be input and outputting the switching instruction signal when the count exceeds a predetermined value.

49. A bit error counting method according to claim 44, wherein the comparing step includes:

a bit comparing step for comparing a delayed reception signal and the re-encoded signal for each bit thereof; and a bit error rate evaluating step for evaluating the bit error rate.

50. A bit error counting method according to claim 49, wherein the re-encoding step includes:

an initializing step for initializing convolution-encoding the decoded signal; and a convolution-encoding step for receiving the decoded signal and outputting the re-encoded signal by convolution-encoding the decoded signal.

51. A bit error counting method according to claim 44, wherein a path memory is provided, and wherein the error correcting/decoding step includes:

a branch metric evaluating step for evaluating a branch metric;

an ACS evaluating step for evaluating a minimum or maximum branch metric value of the evaluated branch metric;

a writing step for writing path information of the minimum or maximum branch metric value yielded by the ACS evaluating step, and a step for indicating whether or not a path memory overflow has occurred, comprising the steps of:

when the path memory overflows, outputting an overflow signal, evaluating a maximum likelihood metric, determining a decoded value, and shifting the path memory, when the path memory does not overflow, executing path convergence, determining a decoded value, and shifting the path memory, and evaluating a maximum likelihood metric and determining a decoded value.

52. A bit error counting method according to claim 51, wherein the re-encoding step includes:

an initializing step for initializing convolution-encoding of the decoded signal; and a convolution-encoding step for receiving the decoded signal and outputting the re-encoded signal by convolution-encoding the decoded signal.

53. A bit error counting method according to claim 52, wherein the comparing step includes:

a bit comparing step for comparing a delayed reception signal and the re-encoded signal for each bit thereof; and a bit error rate evaluating step for evaluating the bit error rate.

54. A bit error counting method for use in transmission/reception in digital communication between a transmission side and a reception side, the method in the transmission side comprising:

an error detecting code evaluating step for receiving an original signal, evaluating an error detecting code from the original signal, and outputting a result of the error detecting code evaluating; and an error correcting/encoding step including an initializing step for initializing convolution-encoding of the input original signal and a convolution-encoding step for receiving the original signal and outputting a transmission signal by convolution-encoding the original signal, the method in the reception side comprising:

an error correcting/decoding step for inputting a reception signal corresponding to the transmission signal and outputting a decoded signal;

an error detecting step for receiving the decoded signal, decoding an error detecting code, and outputting an error detecting signal when any error is detected;

a switching step for receiving the decoded signal and the error detecting code, and outputting at least one of a bit error rate or a number of errors when the error detecting signal is input, and outputting the decoded signal when the error detecting signal is not input:

a re-encoding step for receiving the decoded signal output from the switching step and outputting a re-encoded signal by subjecting the decoded signal to the same encoding as that of the reception signal; and a comparing step for receiving the re-encoded signal and a delayed reception signal and outputting at least one of the bit error rate or the number of errors.

55. A bit error counting method according to claim 54, wherein the error detecting code evaluating step includes:

a selecting step for selecting a predetermined number of bits from the most significant bit of the original signal; and an encoding step for evaluating a remainder polynomial.

56. A bit error counting method according to claim 55, wherein the error detecting step includes:

an encoding step for evaluating a remainder polynomial; and an error detecting signal generating step for comparing the remainder polynomial and part of the decoded signal, and outputting the error detecting signal.

57. A bit error counting method according to claim 55, wherein the switching step includes:

a data input step for inputting the decoded signal and the error detecting signal;

an input signal judging step for judging whether or not the error detecting signal is input;

a decoded signal output step for outputting the decoded signal when the error detecting signal is judged not to be input; and a set value output step for outputting a preset bit error rate and a preset number of errors when the error detecting signal is judged to be input.

58. A bit error counting method according to claim 55, wherein the comparing step includes:

a bit comparing step for comparing a delayed reception signal and the re-encoded signal for each bit thereof; and an error evaluating step for evaluating the bit error rate.

59. A bit error counting method according to claim 55, wherein the step for delaying the reception signal includes:

a step for receiving the reception signal and delaying the reception signal by a time during which the reception signal is processed by the error correcting/decoding step, the error detecting step, the switching step, and the re-encoding step.

60. A bit error counting method according to claim 59, wherein the error detecting step includes:

a selecting step for selecting a predetermined number of bits from the most significant bit of the decoded signal, an encoding step for evaluating a remainder polynomial; and an error detecting signal generating step for comparing the remainder polynomial and part of the decoded signal, and outputting the error detecting signal.

61. A bit error counting method according to claim 59, wherein the switching step includes:

data input step for inputting the decoded signal and the error detecting signal;

an input signal judging step for judging whether or not the error detecting signal is input;

a decoded signal output step for outputting the decoded signal when the error detecting signal is judged not to be input; and a set value output step for outputting a preset bit error rate and a preset number of errors when the error detecting signal is judged to be input.

62. A bit error counting method according to claim 59, wherein the comparing step includes:

a bit comparing step for comparing a delayed reception signal and the re-encoded signal for each bit thereof; and a bit error rate evaluating step for evaluating the bit error rate.

63. A signal identifying method for use in a receiving operation of a digital communication system having transmitter and receiver equipment, the method comprising:

a speech signal processing procedure;

a control signal processing procedure, and a signal identifying procedure, wherein the speech signal processing procedure includes:

an error correcting/decoding step for receiving a reception signal and outputting a decoded signal;

an error detecting step for receiving the decoded signal and outputting an error detecting signal;

a re-encoding step for receiving the decoded signal and outputting a re-encoded signal by subjecting the decoded signal to encoding used in the transmitter equipment; and a comparing step for receiving a delayed reception signal and the re-encoded signal and outputting a number of errors, wherein the control signal processing procedure includes:

an error correcting/decoding step for receiving a reception signal and outputting a decoded signal;

an error detecting step for receiving the decoded signal and outputting an error detecting signal;

a re-encoding step for receiving the decoded signal and outputting a re-encoded signal by subjecting the decoded signal to encoding used in the transmitter equipment; and a comparing step for receiving a delayed reception signal and the re-encoded signal and outputting a number of errors, and wherein the signal identifying procedure includes:

a step for inputting the error detecting signal, the decoded signal, and the number of errors from the speech signal processing step;

a step for judging whether the reception signal is a speech signal or a control signal; and a step for outputting an identification signal, a respective decoded signal and number of errors from at least one of the speech signal processing procedure or the control signal processing procedure.

64. A signal identifying method according to claim 63, further comprising a respective delay step in the speech signal processing procedure and the control signal processing procedure, wherein the respective delay step inputs the reception signal, and delays the reception signal by a time during which the reception signal is processed by the respective error correcting/decoding step, the respective state monitoring step, the respective switching step, and the respective re-encoding step.

65. A signal identifying method for use in a receiving operation of a digital communication system having transmitter and receiver equipment, the method comprising:

a speech signal processing procedure, a control signal processing procedure, and a signal identifying procedure, the speech signal processing procedure including:

an error correcting/decoding step for inputting a reception signal, outputting a decoded signal, and monitoring decoding of the reception signal and, when an overflow occurs during decoding, outputting an overflow signal;

a state monitoring step for receiving the overflow signal, and issuing a switching instruction signal only when the overflow signal is input;

a switching step for receiving the switching instruction signal and the decoded signal, and outputting the switching instruction signal when the switching instruction signal is input and outputting the decoded signal when the switching instruction signal is not input;

a re-encoding step for receiving the decoded signal output from the switching step, and outputting a re-encoded signal by subjecting the decoded signal to the same encoding as that of the reception signal; and a comparing step for receiving the re-encoded signal and a delayed reception signal, and outputting at least one of a bit error rate or a number of errors, the control signal processing procedure including:

an error correcting/decoding step for inputting a reception signal, outputting a decoded signal, and monitoring decoding of the reception signal and when an overflow occurs during decoding, outputting an overflow signal;

a state monitoring step for receiving the overflow signal and issuing a switching instruction signal only when the overflow signal is input;

a switching step for inputting the switching instruction signal and the decoded signal, outputting the switching instruction signal when the switching instruction signal is input, and outputting the decoded signal when the switching instruction signal is not input;

a re-encoding step for receiving the decoded signal output from the switching step and outputting a re-encoded signal by subjecting the decoded signal to the same encoding as that of the reception signal; and a comparing step for receiving the re-encoded signal and a delayed reception signal, and outputting at least one of a bit error rate or a number of errors, the signal identifying procedure including:

a step for receiving the error detection signal, the decoded signal, and the number of errors from the speech signal processing step;

a step for judging whether the reception signal is a speech signal or a control signal; and a step for outputting an identification signal, a respective decoded signal and number of errors from at least one of the speech signal processing procedure or the control signal processing procedure.

66. A signal identifying method according to claim 65, further comprising a delay step for receiving the reception signal and delaying the reception signal by a time during which the reception signal is processed by the respective error correcting/decoding step, the respective state monitoring step, and the respective switching step, and wherein the re-encoding step is included as the delay step for delaying the reception signal in the speech signal processing procedure.

\* \* \* \* \*